(12) United States Patent
Kim

(10) Patent No.: US 11,368,154 B2
(45) Date of Patent: *Jun. 21, 2022

(54) INTEGRATED CLOCK GATING CELL AND INTEGRATED CIRCUIT INCLUDING THE SAME

(71) Applicant: SAMSUNG ELECTRONICS CO., LTD., Suwon-si (KR)

(72) Inventor: Ahreum Kim, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/192,360

(22) Filed: Mar. 4, 2021

(65) Prior Publication Data

US 2021/0194486 A1    Jun. 24, 2021

Related U.S. Application Data

(63) Continuation of application No. 16/913,484, filed on Jun. 26, 2020, now Pat. No. 10,944,401.

(30) Foreign Application Priority Data

Sep. 30, 2019    (KR) .................. 10-2019-0120432

(51) Int. Cl.
*H03K 19/00* (2006.01)
*H03K 3/037* (2006.01)

(52) U.S. Cl.
CPC ......... *H03K 19/0016* (2013.01); *H03K 3/037* (2013.01); *H03K 19/0013* (2013.01)

(58) Field of Classification Search
USPC ..................................... 326/93–99
See application file for complete search history.

(56) References Cited

U.S. PATENT DOCUMENTS

| | | |
|---|---|---|
| 6,204,695 B1 | 3/2001 | Alfke et al. |
| 7,902,878 B2 | 3/2011 | Saint-Laurent et al. |
| 7,928,792 B2 | 4/2011 | Kong et al. |
| 8,276,051 B2 | 9/2012 | Weingarten et al. |
| 8,373,483 B2 | 2/2013 | Dally |
| 8,981,815 B2 | 3/2015 | Guruajarao |
| 9,059,693 B2 | 6/2015 | Singh et al. |
| 9,762,214 B2 | 9/2017 | Kim |

(Continued)

*Primary Examiner* — Anh Q Tran
(74) *Attorney, Agent, or Firm* — F. Chau & Associates, LLC

(57) ABSTRACT

A clock gating cell includes an input logic/latch circuit, a keeper logic/signal generating circuit, and an output driver. The input logic/latch circuit generates an internal enable signal based on first and second input enable signals, and generates a first internal signal provided to a first node based on the internal enable signal and an input clock signal. The keeper logic/signal generating circuit is connected between the first node and a second node, includes a feedback path feeding back the first internal signal, generates a second internal signal provided to the second node based on the first internal signal and the input clock signal, and includes first and second paths discharging the second node. The first and second paths are different. The second path is connected to the feedback path. The output driver generates an output clock signal based on the second internal signal.

20 Claims, 22 Drawing Sheets

(56) References Cited

U.S. PATENT DOCUMENTS

| | | | |
|---|---|---|---|
| 10,075,153 | B2 | 9/2018 | Shin et al. |
| 10,454,457 | B1 | 10/2019 | Mathuria |
| 10,944,401 | B1 * | 3/2021 | Kim .................. H03K 19/0013 |
| 2008/0129359 | A1 | 6/2008 | Lee et al. |
| 2015/0207494 | A1 | 7/2015 | Kim |
| 2019/0173472 | A1 | 6/2019 | Kim et al. |

* cited by examiner

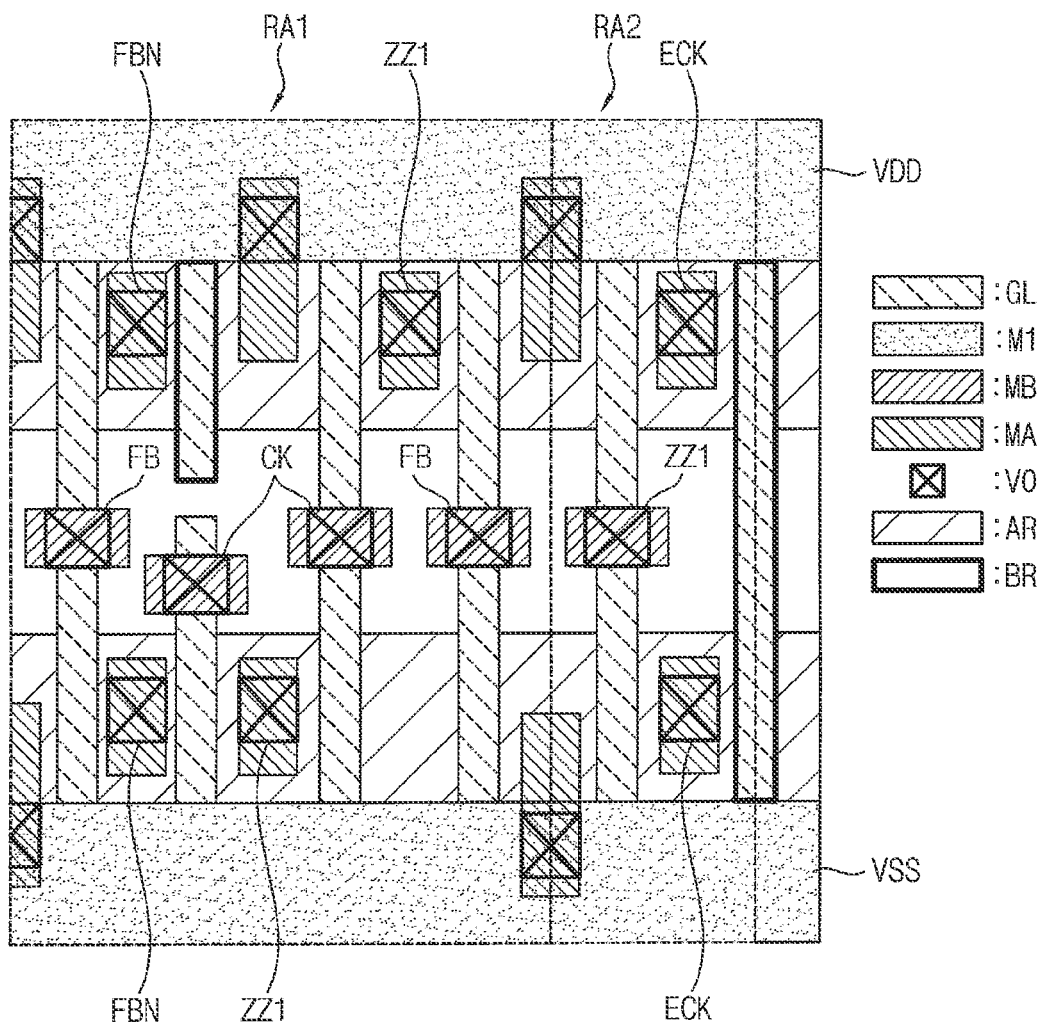

INTEGRATED CLOCK GATING CELL AND INTEGRATED CIRCUIT INCLUDING THE SAME

CROSS-REFERENCE TO RELATED APPLICATIONS

This application is a continuation of U.S. patent application Ser. No. 16/913,484 filed on Jun. 26, 2020, which claims priority under 35 USC § 119 to Korean Patent Application No. 10-2019-0120432, filed on Sep. 30, 2019 in the Korean Intellectual Property Office (KIPO), the disclosures of which are herein incorporated by reference in their entirety.

TECHNICAL FIELD

Exemplary embodiments relate generally to semiconductor integrated circuits, and more particularly, to integrated clock gating cells and integrated circuits including the integrated clock gating cells.

DISCUSSION OF THE RELATED ART

As more logic circuits are integrated into one chip due to the miniaturization of the process, the use of sequential logic cells such as flip-flop and clock gating cells is increasing. Clock gating is a common technique for reducing clock power by shutting off the clock to digital circuit modules by a clock enable signal. Recently, most systems include flip-flops and clock gating cells that supply clock signals to the flip-flops, and it is desirable to reduce the power consumption for the flip-flops and the clock gating cells because these logics have relatively high power consumption. In addition, as the operating frequency increases, the influence of the operating speed of the flip-flops and the clock gating cells on the operating speed of the chip is increasing.

SUMMARY

At least one exemplary embodiment of the present disclosure provides an integrated clock gating cell with relatively low power consumption and high operating speed.

At least one exemplary embodiment of the present disclosure provides an integrated circuit including the integrated clock gating cell.

According to exemplary embodiments, an integrated clock gating cell includes an input logic and latch circuit, a keeper logic and signal generating circuit, and an output driver. The input logic and latch circuit generates an internal enable signal based on a first input enable signal and a second input enable signal, and generates a first internal signal provided to a first node based on the internal enable signal and an input clock signal. The keeper logic and signal generating circuit is connected between the first node and a second node, includes a feedback path for feeding back the first internal signal, generates a second internal signal provided to the second node based on the first internal signal and the input clock signal, and includes a first path and a second path for discharging the second node. The first and second paths are different paths, and the second path is connected to the feedback path. The output driver generates an output clock signal based on the second internal signal.

According to exemplary embodiments, an integrated circuit includes a combinational logic circuit and an integrated clock gating cell. The combinational logic circuit performs a logic operation on data based on an output clock signal. The integrated clock gating cell selectively provides the output clock signal to the combinational logic circuit based on at least one input enable signal and an input clock signal. The integrated clock gating cell includes an input logic and latch circuit, a keeper logic and signal generating circuit, and an output driver. The input logic and latch circuit generates an internal enable signal based on a first input enable signal and a second input enable signal, and generates a first internal signal provided to a first node based on the internal enable signal and the input clock signal. The keeper logic and signal generating circuit is connected between the first node and a second node, includes a feedback path for feeding back the first internal signal, generates a second internal signal provided to the second node based on the first internal signal and the input clock signal, and includes a first path and a second path for discharging the second node. The first and second paths are different paths, and the second path is connected to the feedback path. The output driver generates the output clock signal based on the second internal signal.

According to exemplary embodiments, an integrated clock gating cell includes a NOR gate, a latch, a NAND gate, a feedback inverter, a tri-state inverter, a feedback and discharging circuit, and an output driver. The NOR gate generates an internal enable signal based on a first input enable signal and a second input enable signal. The latch generates a first internal signal provided to a first node based on the internal enable signal and an input clock signal. The NAND gate is connected between the first node and a second node, generates a second internal signal provided to the second node based on the first internal signal and the input clock signal, and includes a first path for discharging the second node. The feedback inverter includes an input terminal connected to the first node and an output terminal connected to a third node, and includes a feedback path for feeding back the first internal signal. The tri-state inverter includes an input terminal connected to the third node and an output terminal connected to the first node, and forms the feedback path. The feedback and discharging circuit is connected between the second node and the third node, and includes a second path for discharging the second node. The output driver generates an output clock signal based on the second internal signal. The first and second paths are different paths, the second path is connected to the feedback path, and the second path is configured to simultaneously perform a feedback function and a discharge function.

The integrated clock gating cell and the integrated circuit according to exemplary embodiments may include a plurality of (e.g., two or more) discharge paths. In addition, at least one of the plurality of discharge paths may be formed or implemented using the feedback inverter that forms the keeper logic, and may simultaneously perform the feedback function and the discharge function. Accordingly, the integrated clock gating cell and the integrated circuit may have relatively low power consumption and high operating speed. Further, as the number of the discharge paths increases, a time required for the output clock signal to be activated after the input clock signal is activated (e.g., CK-to-ECK) may be improved.

BRIEF DESCRIPTION OF THE DRAWINGS

The above and other features of the present disclosure will become more apparent by describing in detail exemplary embodiments thereof with reference to the accompanying drawings, in which:

FIGS. 3A and 3B are diagrams illustrating examples of a layout of elements included in an integrated clock gating cell of FIG. 2.

DETAILED DESCRIPTION OF THE EXEMPLARY EMBODIMENTS

Figure 1:
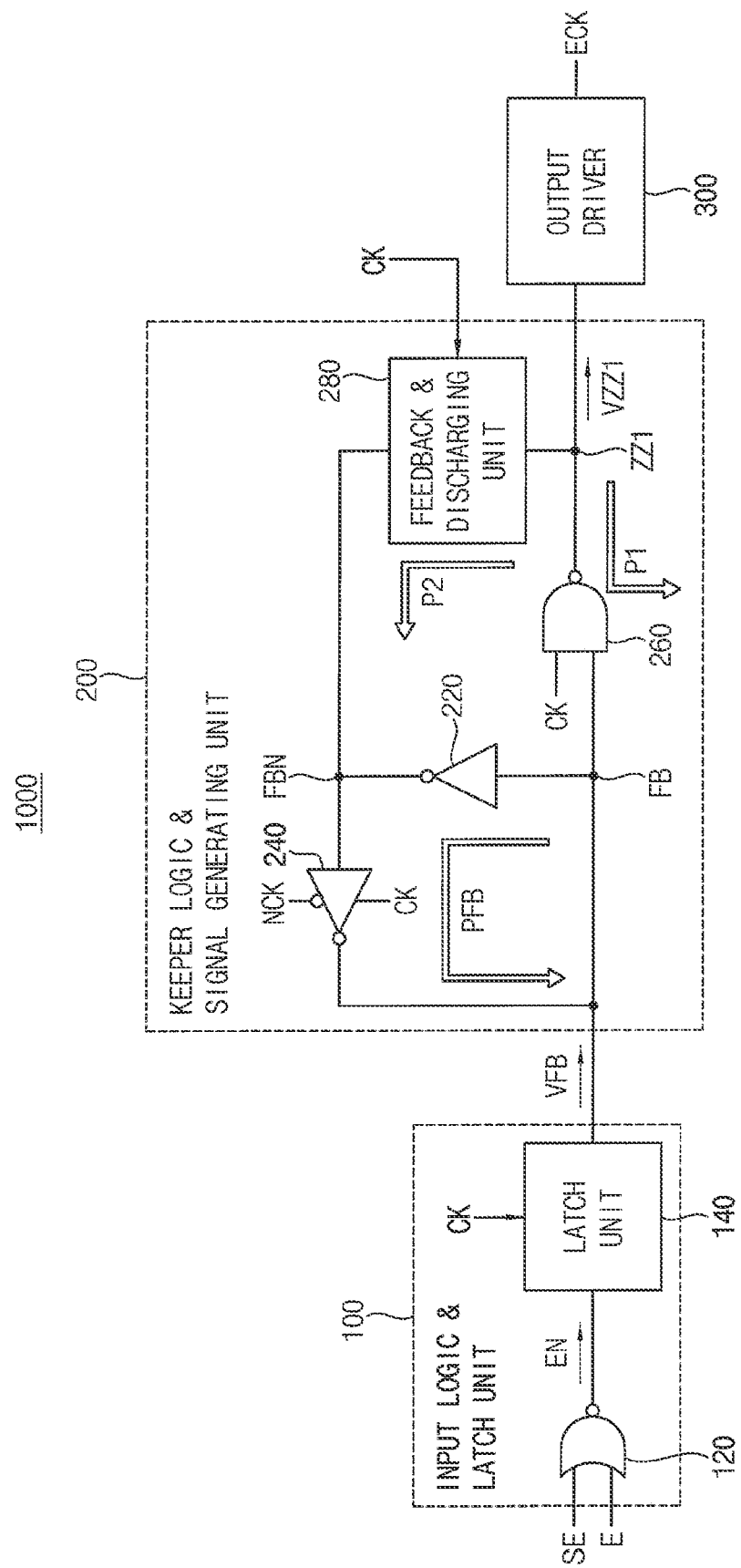
FIG. 1 is a block diagram illustrating an integrated clock gating cell according to exemplary embodiments.

Exemplary embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, when two or more processes or events are described as being performed at or occurring at substantially the same time or substantially simultaneously, it is to be understood that the processes or events may be performed at or may occur at exactly the same time, or at about the same time as would be understood by a person having ordinary skill in the art. For example, the processes or events may be performed at or may occur at about the same time within a measurement error as would be understood by a person having ordinary skill in the art.

FIG. 1 is a block diagram illustrating an integrated clock gating cell according to exemplary embodiments.

Referring to FIG. 1, an integrated clock gating cell 1000 includes an input logic and latch unit 100, a keeper logic and signal generating unit 200, and an output driver 300. The integrated clock gating cell 1000 may also be referred to as an integrated clock gating circuit, the input logic and latch unit 100 may also be referred to as an input logic and latch circuit, the keeper logic and signal generating unit 200 may also be referred to as a keeper logic and signal generating circuit, and the output driver 300 may also be referred to as an output driver circuit.

The input logic and latch unit 100 generates an internal enable signal EN based on a first input enable signal SE and a second input enable signal E, and generates a first internal signal VFB provided to a first node FB based on the internal enable signal EN and an input clock signal CK. For example, the first input enable signal SE may be a scan enable signal associated with a scan test, and the second input enable signal E may be a data enable signal or a normal enable signal, and may be generally referred to as an enable signal associated with normal or general data processing. For example, the first node FB may be a feedback node.

The input logic and latch unit 100 may include a NOR gate 120 and a latch unit 140.

The NOR gate 120 may include a first input terminal receiving the first input enable signal SE, a second input terminal receiving the second input enable signal E, and an output terminal outputting the internal enable signal EN. The NOR gate 120 may perform a NOR operation on the first input enable signal SE and the second input enable signal E to generate the internal enable signal EN.

The latch unit 140 may include a first input terminal receiving the internal enable signal EN, a second input terminal receiving the input clock signal CK, and an output terminal connected to the first node FB. The latch unit 140 may generate the first internal signal VFB based on the internal enable signal EN and the input clock signal CK.

The keeper logic and signal generating unit 200 is connected between the first node FB and a second node ZZ1, includes a feedback path PFB for feeding back the first internal signal VFB, generates a second internal signal VZZ1 provided to the second node ZZ1 based on the first internal signal VFB and the input clock signal CK, and includes a first path P1 and a second path P2 for discharging the second node ZZ1. The first and second paths P1 and P2 are different paths, and the second path P2 is connected to the feedback path PFB. For example, the second node ZZ1 may be an internal node for generating an output clock signal ECK, e.g., a node immediately prior to or preceding the output clock signal ECK.

In exemplary embodiments, the second path P2 may simultaneously perform a feedback function and a discharge function, and thus may be referred to as a feedback and discharge path. For example, the second path P2 may perform the feedback function as directly connected to the feedback path PFB, and may perform the discharge function as directly connected to the second node ZZ1. In contrast, the first path P1 may perform only the discharge function as directly connected only to the second node ZZ1, and thus may be referred to as a discharge path.

The keeper logic and signal generating unit 200 may include a feedback inverter 220, a tri-state inverter 240, a NAND gate 260, and a feedback and discharging unit 280. The feedback and discharging unit 280 may also be referred to as a feedback and discharging circuit.

The feedback inverter 220 may include an input terminal connected to the first node FB and an output terminal connected to a third node FBN, may form the feedback path PFB, and may invert the first internal signal VFB. For example, the third node FBN may be an inverted feedback node.

The tri-state inverter 240 may include an input terminal connected to the third node FBN and an output terminal connected to the first node FB, may form the feedback path PFB, and may operate based on the input clock signal CK and an inverted input clock signal NCK.

For example, the feedback path PFB may be formed or implemented by the feedback inverter 220 and the tri-state inverter 240. In addition, the feedback inverter 220 and the tri-state inverter 240 may form a keeper logic.

The NAND gate 260 may include a first input terminal receiving the input clock signal CK, a second input terminal connected to the first node FB, and an output terminal connected to the second node ZZ1, and may form the first path P1. The NAND gate 260 may perform a NAND operation on the input clock signal CK and the first internal signal VFB to generate the second internal signal VZZ1. The NAND gate 260 may form a signal generating unit.

The feedback and discharging unit 280 may be connected between the second node ZZ1 and the third node FBN, may form the second path P2, and may operate based on the input clock signal CK.

The output driver 300 generates the output clock signal ECK based on the second internal signal VZZ1.

Detailed configurations and various exemplary embodiments of the input logic and latch unit 100, the keeper logic and signal generating unit 200, and the output driver 300 will be described with reference to the following figures, including FIGS. 2 and 4.

Unlike a conventional integrated clock gating cell including a single discharge path, the integrated clock gating cell 1000 according to exemplary embodiments may include a plurality of (e.g., two or more) discharge paths (e.g., the first path P1 and the second path P2). In addition, at least one (e.g., the second path P2) of the plurality of discharge paths may be formed or implemented using the feedback inverter 220 that forms the keeper logic, and may simultaneously perform the feedback function and the discharge function. Accordingly, the integrated clock gating cell 1000 may have relatively low power consumption and high operating speed. Further, as the number of the discharge paths for the second node ZZ1 which is the internal node increases, a time required for the output clock signal ECK to be activated after the input clock signal CK is activated (e.g., CK-to-ECK) may be improved.

Figure 2:
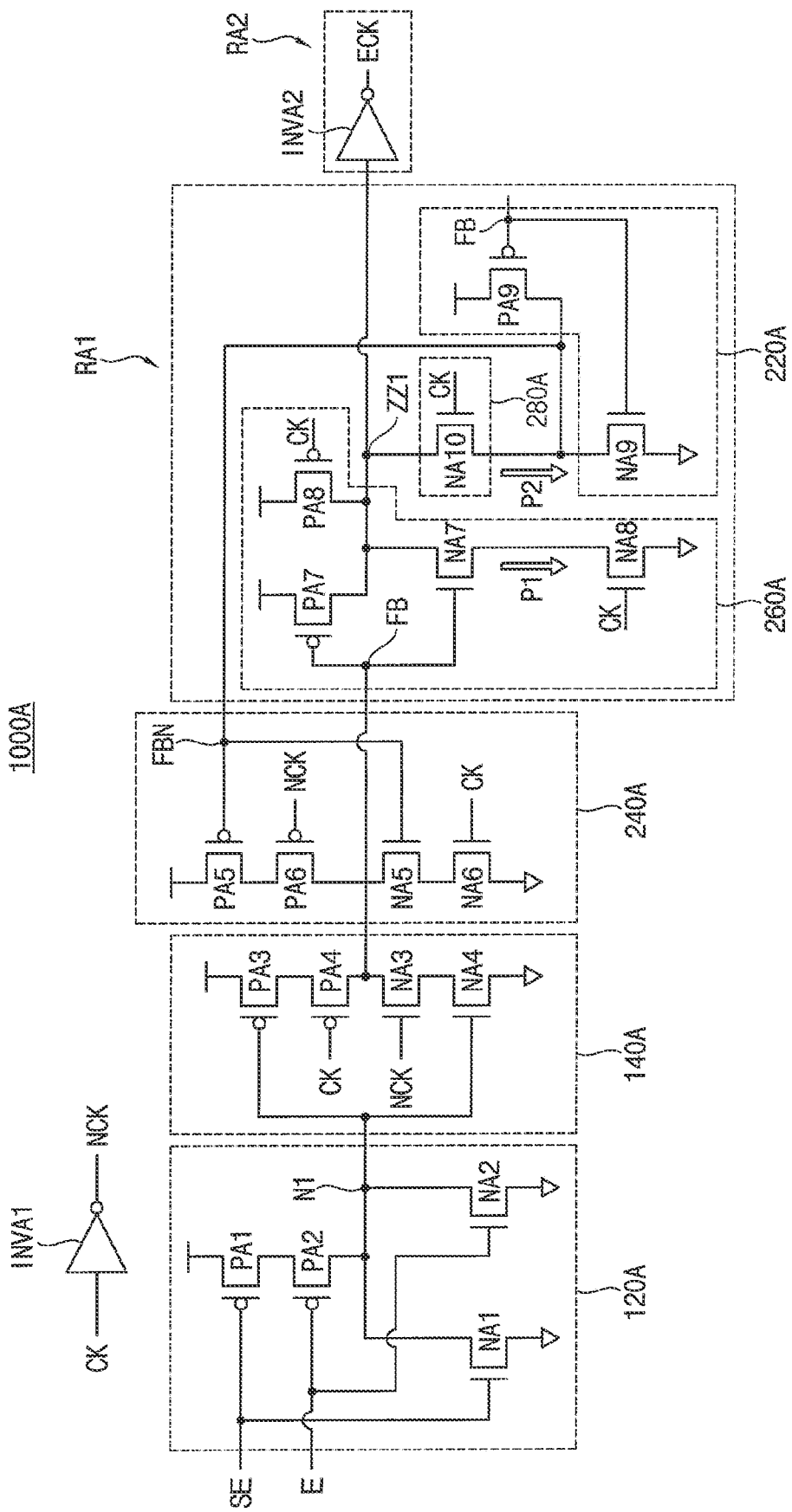
FIG. 2 is a circuit diagram illustrating an example of an integrated clock gating cell of FIG. 1.

FIG. 2 is a circuit diagram illustrating an example of an integrated clock gating cell of FIG. 1.

Referring to FIG. 2, an integrated clock gating cell 1000A may include a NOR gate 120A, a latch unit 140A, a feedback inverter 220A, a tri-state inverter 240A, a NAND gate 260A, a feedback and discharging unit 280A, and inverters INVA1 and INVA2.

In a circuit diagram such as FIG. 2, a horizontal line (e.g.,-) connected to one electrode of a transistor represents a power supply voltage (e.g., VDD), and an inverted triangle (e.g., ∇) connected to one electrode of a transistor represents a ground voltage (e.g., GND or VSS).

The NOR gate 120A may include p-type metal oxide semiconductor (PMOS) transistors PA1 and PA2, and n-type metal oxide semiconductor (NMOS) transistors NA1 and NA2. The PMOS transistors PA1 and PA2 may be connected in series between the power supply voltage and a node N1. A control electrode (e.g., a gate electrode) of the PMOS transistor PA1 may receive the first input enable signal SE, and a control electrode of the PMOS transistor PA2 may receive the second input enable signal E. The NMOS transistors NA1 and NA2 may be connected in parallel between the node N1 and the ground voltage. A control electrode of the NMOS transistor NA1 may receive the first input enable signal SE, and a control electrode of the NMOS transistor NA2 may receive the second input enable signal E. The node N1 may correspond to an output terminal of the NOR gate 120A.

The latch unit 140A may include PMOS transistors PA3 and PA4, and NMOS transistors NA3 and NA4. The PMOS transistors PA3 and PA4 may be connected in series between the power supply voltage and the first node FB. A control electrode of the PMOS transistor PA3 may be connected to the node N1 to receive the internal enable signal EN, and a control electrode of the PMOS transistor PA4 may receive the input clock signal CK. The NMOS transistors NA3 and NA4 may be connected in series between the first node FB and the ground voltage. A control electrode of the NMOS transistor NA3 may receive the inverted input clock signal NCK, and a control electrode of the NMOS transistor NA4 may be connected to the node N1 to receive the internal enable signal EN.

The NOR gate 120A and the latch unit 140A may form the input logic and latch unit (e.g., the input logic and latch unit 100 in FIG. 1).

The tri-state inverter 240A may include PMOS transistors PA5 and PA6, and NMOS transistors NA5 and NA6. The PMOS transistors PA5 and PA6 may be connected in series between the power supply voltage and the first node FB. A control electrode of the PMOS transistor PA5 may be connected to the third node FBN, and a control electrode of the PMOS transistor PA6 may receive the inverted input clock signal NCK. The NMOS transistors NA5 and NA6 may be connected in series between the first node FB and the ground voltage. A control electrode of the NMOS transistor NA5 may be connected to the third node FBN, and a control electrode of the NMOS transistor NA6 may receive the input clock signal CK.

The NAND gate 260A may include PMOS transistors PA7 and PA8, and NMOS transistors NA7 and NA8. The PMOS transistors PA7 and PA8 may be connected in parallel between the power supply voltage and the second node ZZ1. A control electrode of the PMOS transistor PA7 may be connected to the first node FB, and a control electrode of the PMOS transistor PA8 may receive the input clock signal CK. The NMOS transistors NA7 and NA8 may be connected in series between the second node ZZ1 and the ground voltage. A control electrode of the NMOS transistor NA7 may be connected to the first node FB, and a control electrode of the NMOS transistor NA8 may receive the input clock signal CK. The NMOS transistors NA7 and NA8 may form the first path P1 for discharging the second node ZZ1.

The feedback inverter 220A may include a PMOS transistor PA9 and an NMOS transistor NA9. The PMOS transistor PA9 may be connected between the power supply voltage and the third node FBN, and may include a control electrode connected to the first node FB. The NMOS transistor NA9 may be connected between the third node FBN and the ground voltage, and may include a control electrode connected to the first node FB.

The feedback and discharging unit 280A may include an NMOS transistor NA10. The NMOS transistor NA10 may include a first electrode connected to the second node ZZ1, a control electrode receiving the input clock signal CK, and a second electrode connected to the third node FBN. The NMOS transistor NA10 may form the second path P2 for discharging the second node ZZ1 (e.g., for performing the discharge function). In addition, the second path P2 may be directly connected to the feedback path PFB to perform the feedback function. The feedback function and the discharge function may be substantially simultaneously performed. The second path P2 may be relatively simply implemented using a single transistor NA10.

The feedback inverter 220A, the tri-state inverter 240A, the NAND gate 260A, and the feedback and discharging unit 280A may form the keeper logic and signal generating unit (e.g., the keeper logic and signal generating unit 200 in FIG. 1).

The inverter INVA1 may receive the input clock signal CK, and may invert the input clock signal CK to output the inverted input clock signal NCK. The inverter INVA2 may be connected to the second node ZZ1 to receive the second internal signal VZZ1, and may invert the second internal signal VZZ1 to output the output clock signal ECK. The inverter INVA2 may form the output driver (e.g., the output driver 300 in FIG. 1).

Regions RA1 and RA2 illustrated in FIG. 2 will be described further with reference to FIGS. 3A and 3B.

According to exemplary embodiments, configurations of the latch unit 140A, the feedback inverter 220A, and the tri-state inverter 240A in FIG. 2 may be changed, which will be described with reference to FIGS. 6C, 7, 9, 11, 13 and 15.

Figure 3B:
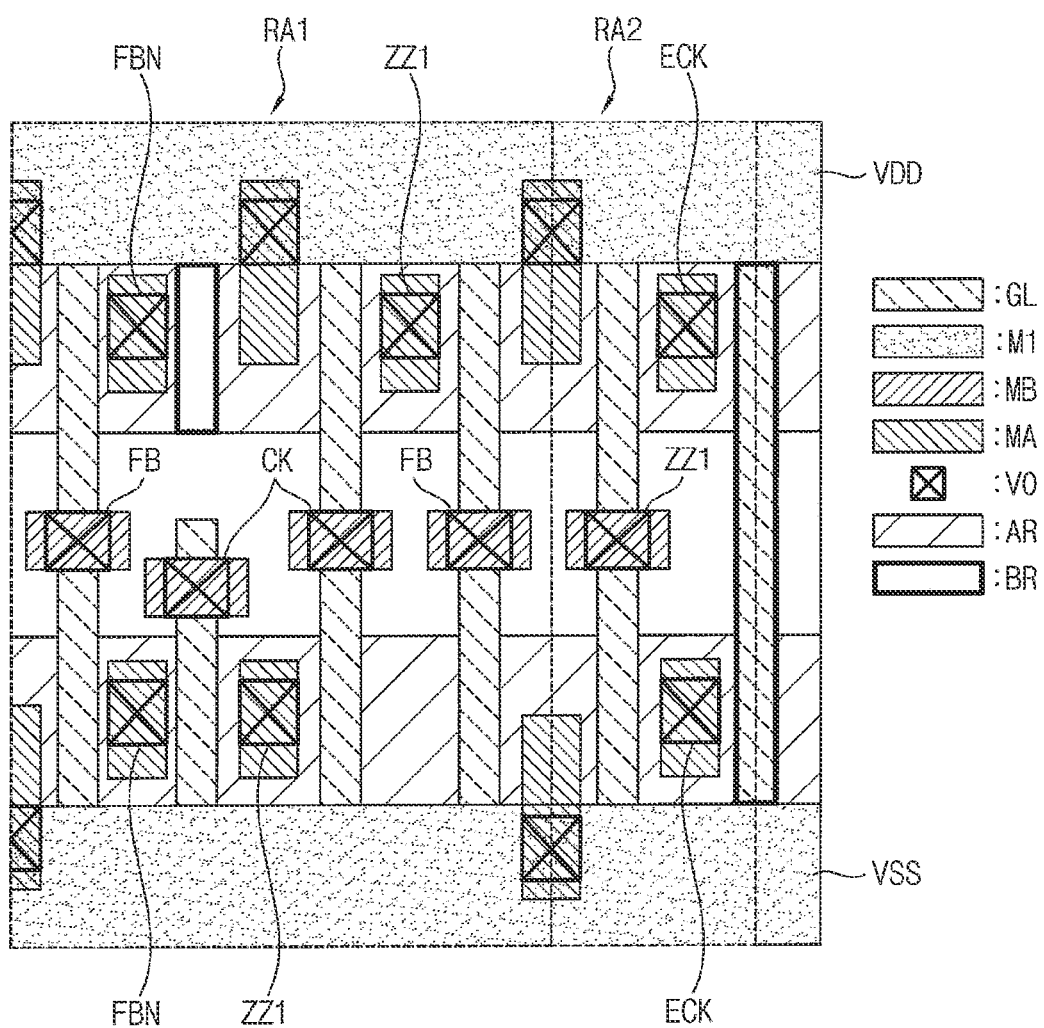

FIGS. 3A and 3B are diagrams illustrating examples of a layout of elements included in an integrated clock gating cell of FIG. 2.

In FIGS. 3A and 3B, GL represents gate lines, V0 represents vias, and AR represents active regions. M1 represents first metal lines associated with the power supply voltage VDD and the ground voltage VSS, MB represents second metal lines connecting the gate lines GL with the vias V0, and MA represents third metal lines connecting the active regions AR with the vias V0. BR represents break regions including an active fin or an active region cut. In addition, FB, ZZ1 and FBN indicated at the vias V0 represent the first node FB, the second node ZZ1 and the third node FBN included in the integrated clock gating cell 1000A of FIG. 2, respectively. CK and ECK indicated at the vias V0 represent nodes receiving the input clock signal CK and nodes outputting the output clock signal ECK included in the integrated clock gating cell 1000A of FIG. 2, respectively.

Referring to FIGS. 3A and 3B, a layout of a partial region RA1 of the keeper logic and signal generating unit and a region RA2 of the output driver included in the integrated clock gating cell 1000A of FIG. 2 is illustrated.

In an example of FIG. 3A, the NMOS transistor NA10 included in the feedback and discharging unit 280A may be implemented by adding a gate line, a second metal line and a CK via connected thereto between a FBN via and a ZZ1 via disposed at a lower portion of the region RA1, and thus the second path P2 may be relatively simply implemented. As compared with the example of FIG. 3A, a gate line in a break region BR may be omitted in an example of FIG. 3B. In the examples of FIGS. 3A and 3B, an order of arrangement of the lines and the vias in the region RA1 may be changed from left to right. For example, the layout may be changed such that the leftmost lines and vias are arranged on the rightmost side and the rightmost lines and vias are arranged on the leftmost side.

Figure 4:
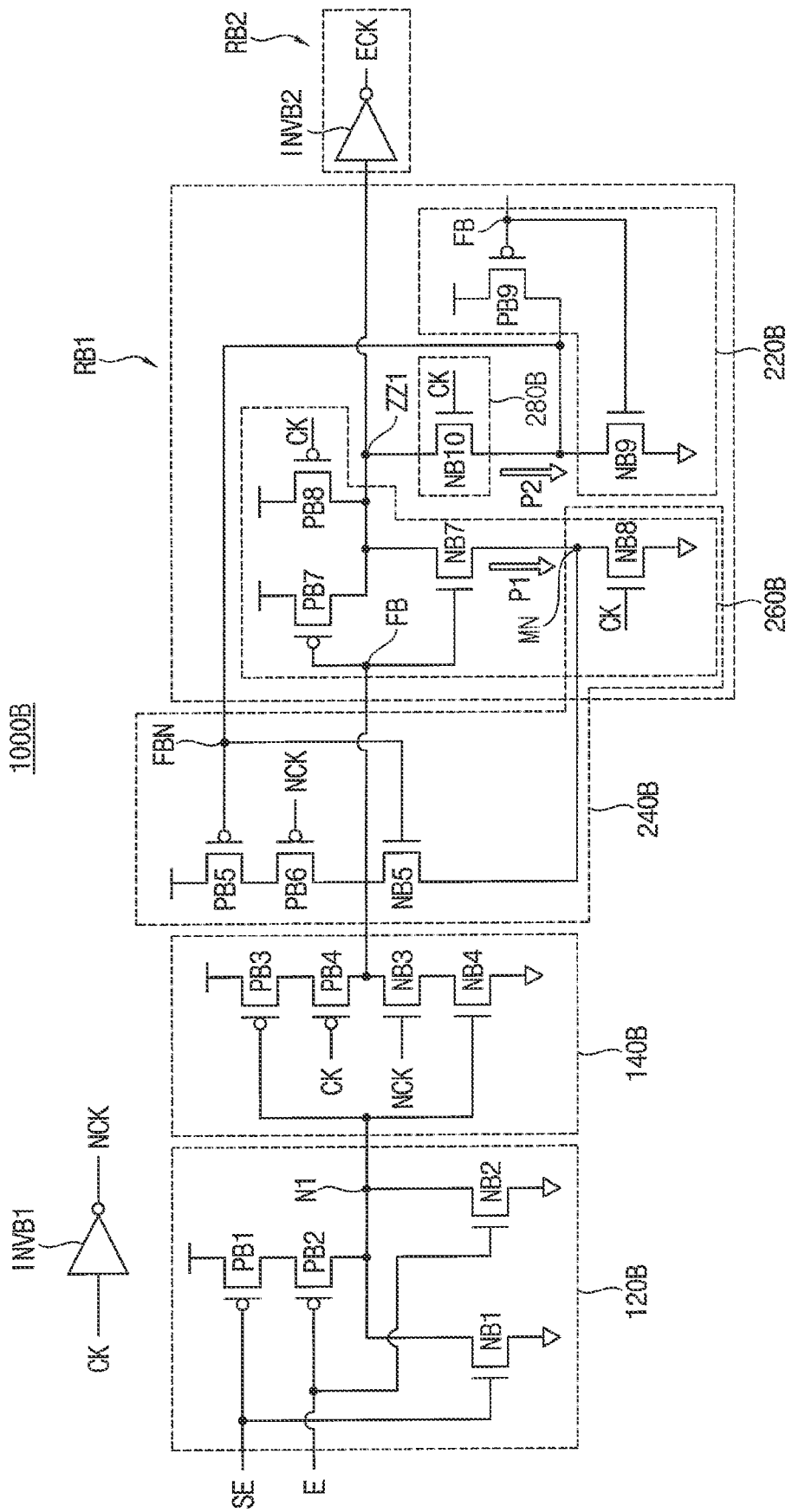
FIG. 4 is a circuit diagram illustrating an example of an integrated clock gating cell of FIG. 1.

FIG. 4 is a circuit diagram illustrating an example of an integrated clock gating cell of FIG. 1. For convenience of explanation, a further description of elements and aspects previously described will be omitted.

Referring to FIG. 4, an integrated clock gating cell 1000B may include a NOR gate 120B, a latch unit 140B, a feedback inverter 220B, a tri-state inverter 240B, a NAND gate 260B, a feedback and discharging unit 280B, and inverters INVB1 and INVB2.

The integrated clock gating cell 1000B of FIG. 4 may be substantially the same as the integrated clock gating cell 1000A of FIG. 2, except that configurations of the tri-state inverter 240B and the NAND gate 260B are partially changed. For example, transistors PB1, PB2, NB1, NB2, PB3, PB4, NB3, NB4, PB9, NB9 and NB10 included in the NOR gate 120B, the latch unit 140B, the feedback inverter 220B and the feedback and discharging unit 280B in FIG. 4 may be substantially the same as the transistors PA1, PA2, NA1, NA2, PA3, PA4, NA3, NA4, PA9, NA9 and NA10 included in the NOR gate 120A, the latch unit 140A, the feedback inverter 220A and the feedback and discharging unit 280A in FIG. 2, respectively, and the inverters INVB1 and INVB2 in FIG. 4 may be substantially the same as the inverters INVA1 and INVA2 in FIG. 2, respectively.

The tri-state inverter 240B may include PMOS transistors PB5 and PB6, and NMOS transistors NB5 and NB8. The PMOS transistors PB5 and PB6 may be connected in series between the power supply voltage and the first node FB. A control electrode of the PMOS transistor PB5 may be connected to the third node FBN, and a control electrode of the PMOS transistor PB6 may receive the inverted input clock signal NCK. The NMOS transistors NB5 and NB8 may be connected in series between the first node FB and the ground voltage. A control electrode of the NMOS transistor NB5 may be connected to the third node FBN, and a control electrode of the NMOS transistor NB8 may receive the input clock signal CK.

The NAND gate 260B may include PMOS transistors PB7 and PB8, and NMOS transistors NB7 and NB8. The PMOS transistors PB7 and PB8 may be connected in parallel between the power supply voltage and the second node ZZ1. A control electrode of the PMOS transistor PB7 may be connected to the first node FB, and a control electrode of the PMOS transistor PB8 may receive the input clock signal CK. The NMOS transistors NB7 and NB8 may be connected in series between the second node ZZ1 and the ground voltage. A control electrode of the NMOS transistor NB7 may be connected to the first node FB, and a control electrode of the NMOS transistor NB8 may receive the input clock signal CK.

In an example of FIG. 4, the tri-state inverter 240B and the NAND gate 260B may share at least one element (e.g., at least one circuit component). For example, the NMOS transistor NB8 may be shared by the tri-state inverter 240B and the NAND gate 260B. As compared with the example of FIG. 2, two NMOS transistors NA6 and NA8 in FIG. 2 that receive the input clock signal CK may be merged into a single NMOS transistor NB8 in FIG. 4. For example, first ends of the NMOS transistors NB5 and NB7 in FIG. 4 may be connected to each other to form a merged node MN, and only one NMOS transistor NB8 may be connected to the merged node MN, and thus, one of two NMOS transistors NA6 and NA8 (e.g., the NMOS transistor NA6) in FIG. 2 may be omitted. Accordingly, the integrated clock gating cell 1000B of FIG. 4 may have a relatively small area, low power consumption and high operating speed.

According to exemplary embodiments, configurations of the latch unit 140B, the feedback inverter 220B, and the tri-state inverter 240B in FIG. 4 may be changed, which will be described with reference to FIGS. 6D, 8, 10, 12, 14 and 16.

Regions RB1 and RB2 illustrated in FIG. 4 will be described below with reference to FIGS. 5A and 5B.

Figure 5A:
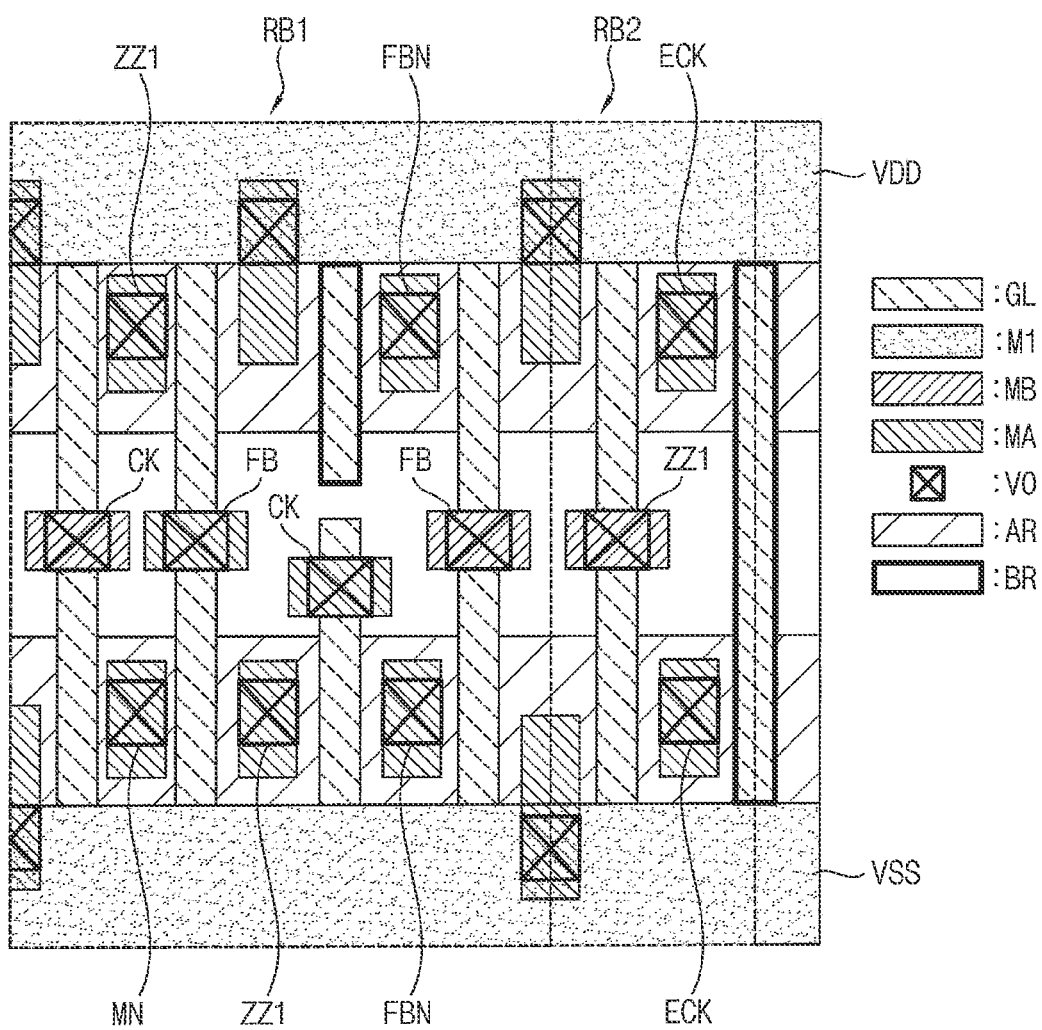
FIGS. 5A and 5B are diagrams illustrating examples of a layout of elements included in an integrated clock gating cell of FIG. 4.
Figure 5B:
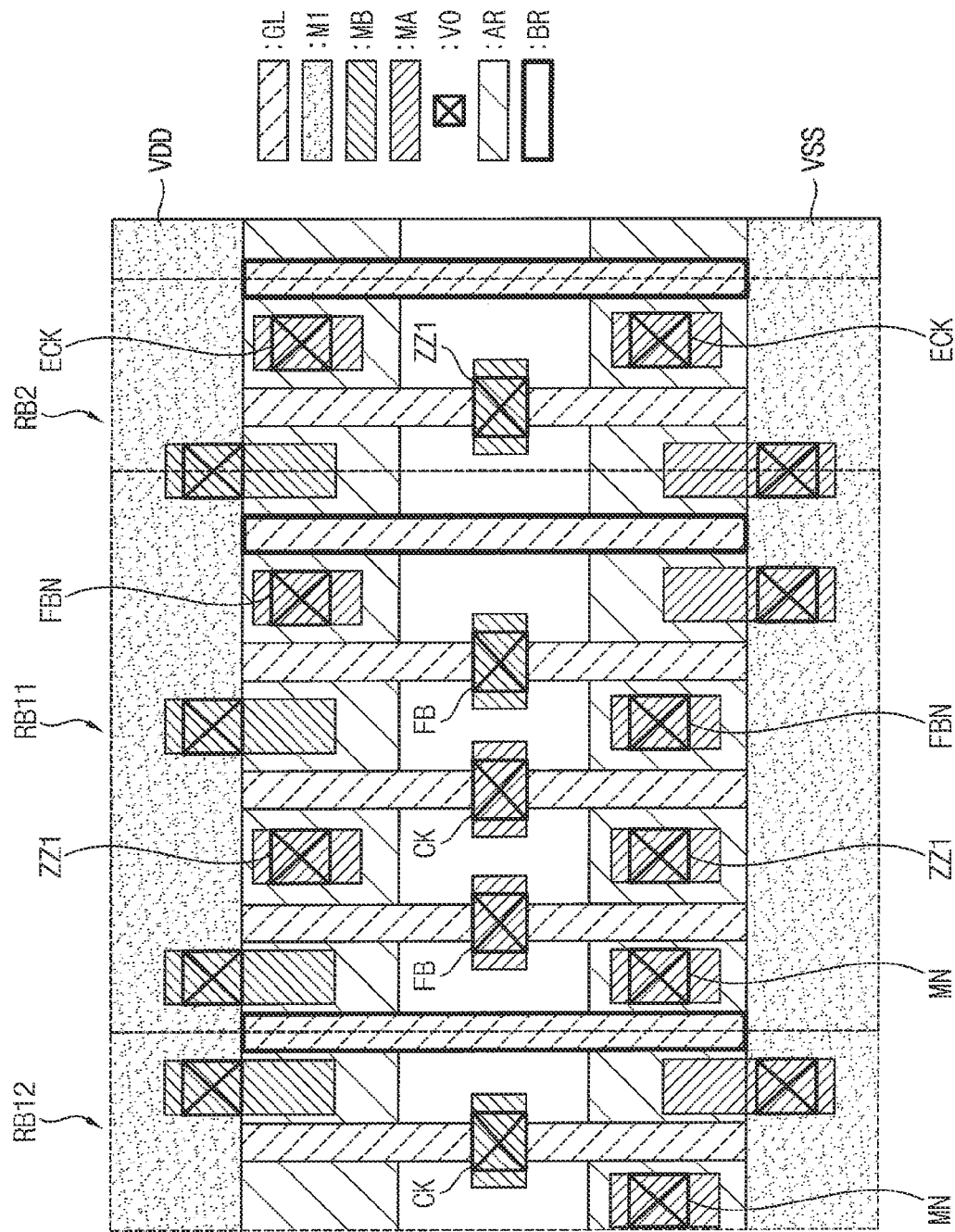

FIGS. 5A and 5B are diagrams illustrating examples of a layout of elements included in an integrated clock gating cell of FIG. 4. For convenience of explanation, a further description of elements and aspects previously described will be omitted.

Referring to FIGS. 5A and 5B, a layout of a partial region RB1 of the keeper logic and signal generating unit and a region RB2 of the output driver included in the integrated clock gating cell 1000B of FIG. 4 is illustrated. In FIG. 5B, the region RB1 may be divided into a region RB12 including the NMOS transistor NB8 and a region RB11 other than the region RB12 in the region RB1.

As with the example of FIG. 3A, the NMOS transistor NB10 included in the feedback and discharging unit 280B may be implemented by adding a gate line, a second metal line and a CK via connected thereto between a FBN via and a ZZ1 via disposed at a lower portion of the region RB1 in an example of FIG. 5A, and thus the second path P2 may be relatively simply implemented. In the example of FIG. 5A, an order of arrangement of the lines and the vias in the region RB1 may be changed from left to right. As compared with the example of FIG. 5A, positions of CK vias and lines connected thereto may be changed in an example of FIG. 5B. In the example of FIG. 5B, the region RB12 may be disposed to be adjacent to the region RB11, and is not located directly next to the region RB11 according to exemplary embodiments.

Figure 6A:
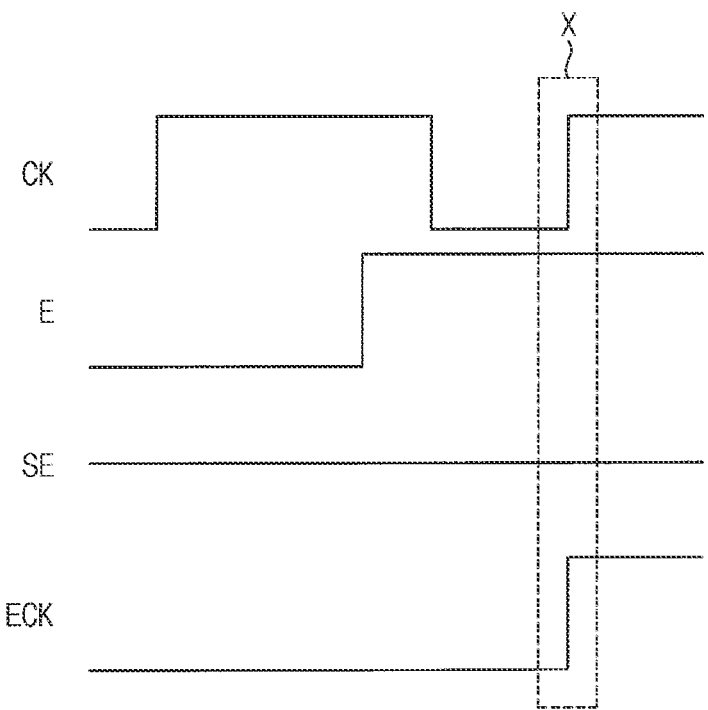
FIGS. 6A and 6B are timing diagrams illustrating an operation of integrated clock gating cells of FIGS. 2 and 4.
Figure 6B:
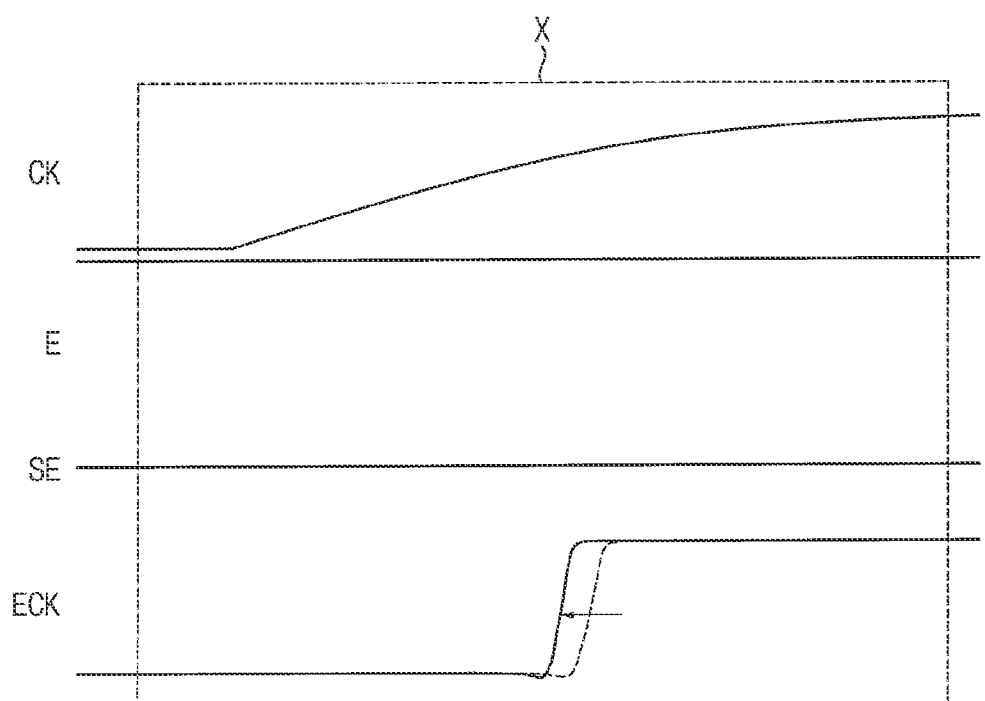

FIGS. 6A and 6B are timing diagrams illustrating an operation of integrated clock gating cells of FIGS. 2 and 4. FIG. 6B is an enlarged view of a portion "X" in FIG. 6A.

Referring to FIGS. 2, 4, 6A and 6B, an operation of the integrated clock gating cells 1000A and 1000B are as follows.

When the input clock signal CK has a logic low level, the second node ZZ1 may be set to a logic high value. Logic values of the first node FB and the third node FBN may be determined based on the first and second input enable signals SE and E.

For example, when both the first and second input enable signals SE and E have the logic low level, the first node FB may be set to a logic low value and the third node FBN may be set to a logic high value. In this case, the second node ZZ1 may be maintained at the logic high value even if the input clock signal CK is changed to a logic high level. In addition, the first node FB may be maintained at the logic low value and the third node FBN may be maintained at the logic high value even if the internal enable signal EN is changed to the logic low level based on one of the first and second input enable signals SE and E.

In contrast, when the input clock signal CK has the logic low level and one of the first and second input enable signals SE and E has the logic high level, the first node FB may be set to the logic high value and the third node FBN may be set to the logic low value. In this case, when the input clock signal CK is changed to the logic high level, the discharge operation for the second node ZZ1 may be started through the two paths P1 and P2, and the second node ZZ1 may be changed from the logic high value to the logic low value. As the number of the discharge paths for the second node ZZ1 increases, the time required for the output clock signal ECK to be activated after the input clock signal CK is activated (e.g., CK-to-ECK) may be improved.

FIGS. 6A and 6B illustrate an example in which the second input enable signal E is transitioned from the logic low level to the logic high level. As illustrated by an arrow in FIG. 6B, a transition time of the output clock signal ECK illustrated by a solid line generated from the integrated clock gating cells 1000A and 1000B according to exemplary embodiments may be advanced or move forward, as compared with an output clock signal illustrated by a dotted line generated from a conventional integrated clock gating cell, and thus, the CK-to-ECK may be improved. Typically, the CK-to-ECK may represent a time interval from a first time point at which a level of the input clock signal CK rises to about a half of the high level to a second time point at which a level of the output clock signal ECK rises to about a half of the high level.

Figure 6C:
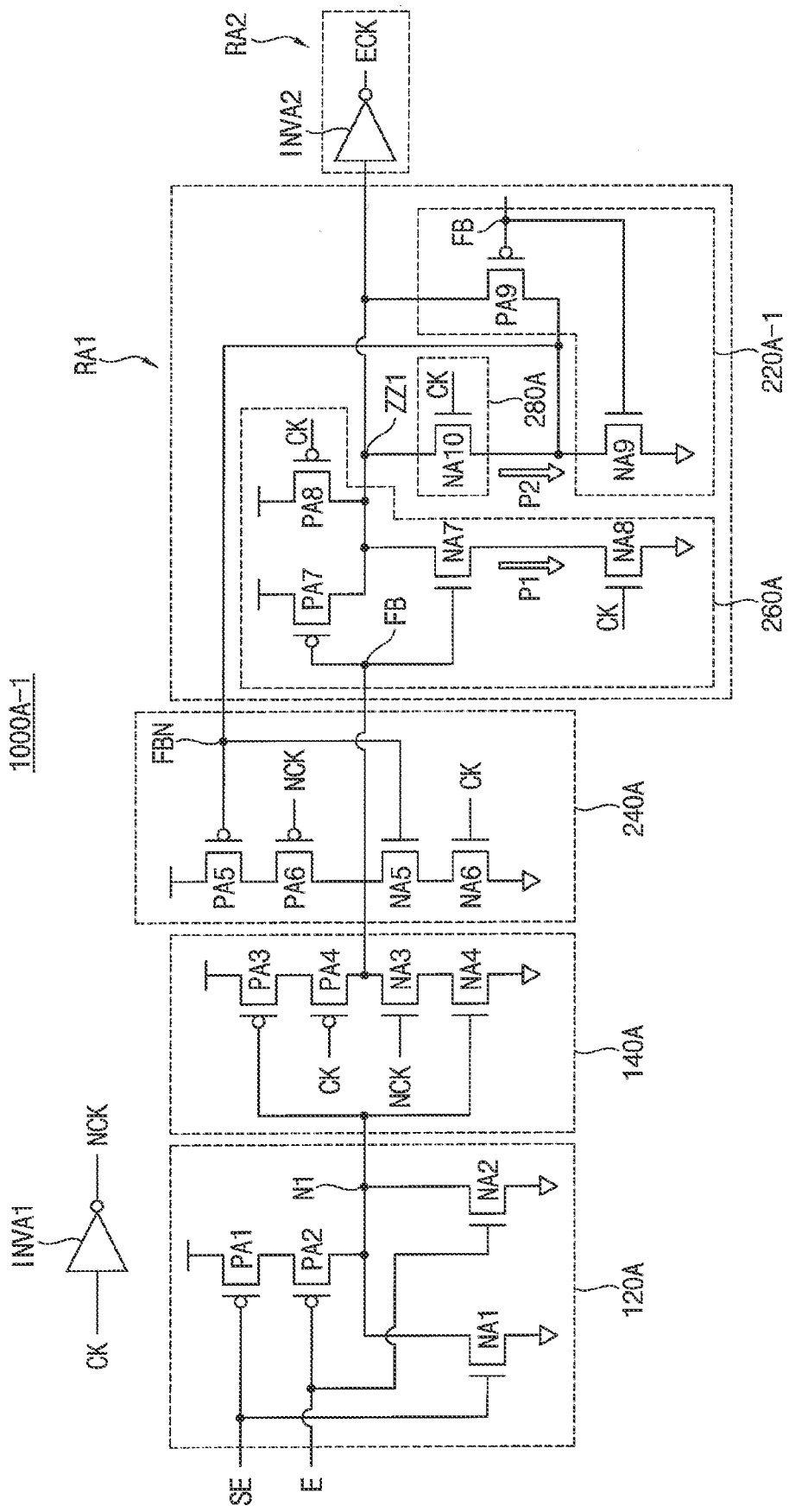
FIGS. 6C and 6D are circuit diagrams illustrating examples of an integrated clock gating cell of FIG. 1.
Figure 6D:
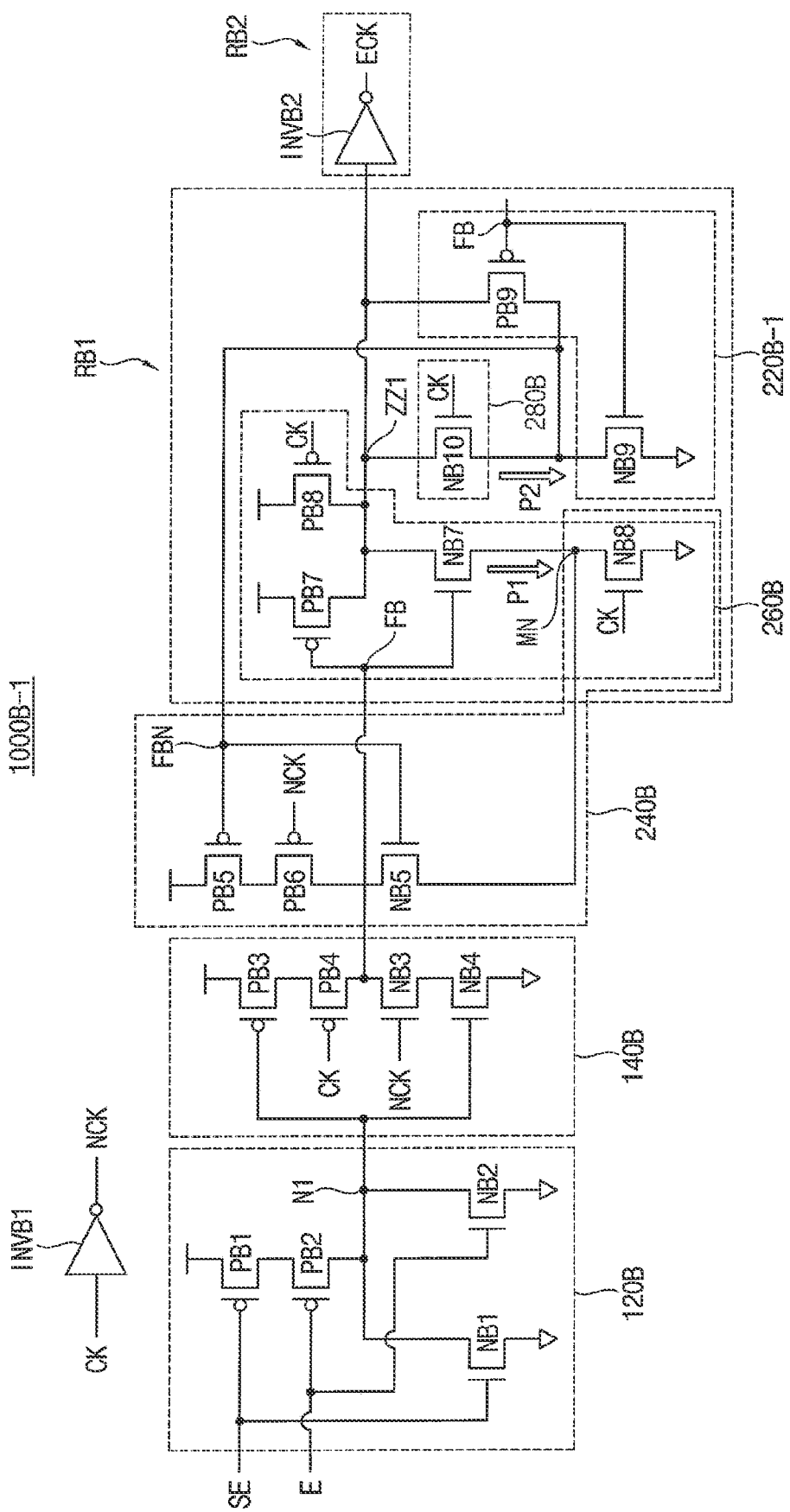

FIGS. 6C and 6D are circuit diagrams illustrating examples of an integrated clock gating cell of FIG. 1. For convenience of explanation, a further description of elements and aspects previously described will be omitted.

Referring to FIG. 6C, an integrated clock gating cell 1000A-1 may include a NOR gate 120A, a latch unit 140A, a feedback inverter 220A-1, a tri-state inverter 240A, a NAND gate 260A, a feedback and discharging unit 280A, and inverters INVA1 and INVA2.

The integrated clock gating cell 1000A-1 of FIG. 6C may be substantially the same as the integrated clock gating cell 1000A of FIG. 2, except that a configuration of the feedback inverter 220A-1 is partially changed.

The feedback inverter 220A-1 may include a PMOS transistor PA9 and an NMOS transistor NA9. The PMOS transistor PA9 may be connected between the second node ZZ1 and the third node FBN, and may include a control electrode connected to the first node FB. The NMOS transistor NA9 may be connected between the third node FBN and the ground voltage, and may include a control electrode connected to the first node FB. In an example of FIG. 6C, the feedback inverter 220A-1 may be connected to the second node ZZ1 instead of the power supply voltage.

Referring to FIG. 6D, an integrated clock gating cell 1000B-1 may include a NOR gate 120B, a latch unit 140B, a feedback inverter 220B-1, a tri-state inverter 240B, a NAND gate 260B, a feedback and discharging unit 280B, and inverters INVB1 and INVB2.

The integrated clock gating cell 1000B-1 of FIG. 6D may be substantially the same as the integrated clock gating cell 1000B of FIG. 4, except that a configuration of the feedback inverter 220B-1 is partially changed. The feedback inverter 220B-1 in FIG. 6D may be substantially the same as the feedback inverter 220A-1 in FIG. 6C. For example, transistors PB9 and NB9 included in the feedback inverter 220B-1 of FIG. 6D may be substantially the same as the transistors PA9 and NA9 included in the feedback inverter 220A-1 of FIG. 6C, respectively.

FIGS. 7, 8, 9, 10, 11, 12, 13, 14, 15 and 16 are circuit diagrams illustrating examples of an integrated clock gating cell of FIG. 1. For convenience of explanation, a further description of elements and aspects previously described will be omitted.

FIGS. 7, 8, 9, 10, 11, 12, 13, 14, 15 and 16 illustrate examples in which the latch unit (e.g., the latch unit 140A in FIG. 2 and/or the latch unit 140B in FIG. 4), the tri-state inverter (e.g., the tri-state inverter 240A in FIG. 2 and/or the tri-state inverter 240B in FIG. 4) and/or a portion associated with thereof among the elements included in the integrated clock gating cell are changed. Thus, the NOR gate 120 and the feedback inverter 220 whose structure are not changed are illustrated by a block diagram rather than a circuit diagram for convenience of illustration.

Figure 7:
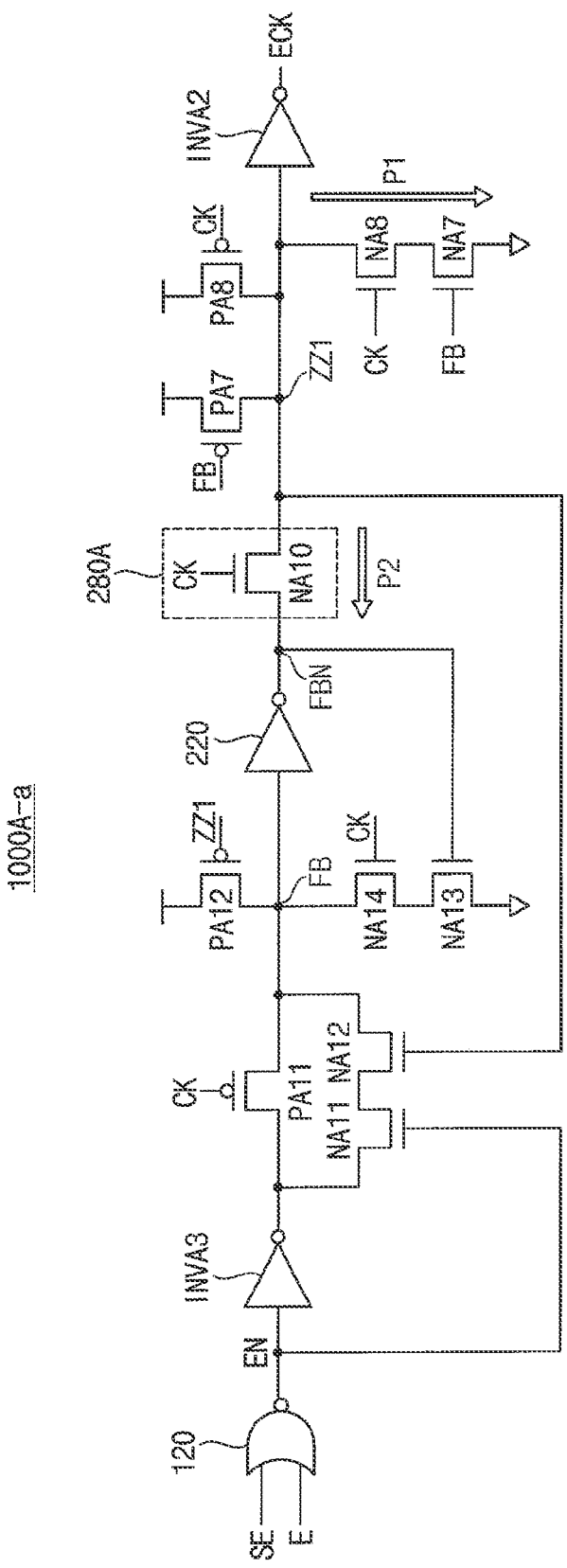
FIGS. 7, 8, 9, 10, 11, 12, 13, 14, 15 and 16 are circuit diagrams illustrating examples of an integrated clock gating cell of FIG. 1.

Referring to FIG. 7, an integrated clock gating cell 1000A-a may include a NOR gate 120, inverters INVA3, 220 and INVA2, PMOS transistors PA11, PA12, PA7 and PA8, and NMOS transistors NA11, NA12, NA13, NA14, NA10, NA7 and NA8. FIG. 7 illustrates an example in which configurations of the latch unit 140A and the tri-state inverter 240A are changed in the example of FIG. 2.

The inverter INVA3 may include an input terminal receiving the internal enable signal EN, and an output terminal. The PMOS transistor PA11 may be connected between the output terminal of the inverter INVA3 and the first node FB, and may include a control electrode receiving the input clock signal CK. The NMOS transistors NA11 and NA12 may be connected in series between the output terminal of the inverter INVA3 and the first node FB, and may be connected in parallel with the PMOS transistor PA11 between the output terminal of the inverter INVA3 and the first node FB. A control electrode of the NMOS transistor NA11 may be connected to the input terminal of the inverter INVA3, and a control electrode of the NMOS transistor NA12 may be connected to the second node ZZ1.

The inverter INVA3, the PMOS transistor PA11 and the NMOS transistors NA11 and NA12 may form the latch unit (e.g., the latch unit 140 in FIG. 1).

The PMOS transistor PA12 may be connected between the power supply voltage and the first node FB, and may include a control electrode connected to the second node ZZ1. The NMOS transistors NA13 and NA14 may be connected in series between the first node FB and the ground voltage. A control electrode of the NMOS transistor NA13 may be connected to the third node FBN, and a control electrode of the NMOS transistor NA14 may receive the input clock signal CK.

The PMOS transistor PA12 and the NMOS transistors NA13 and NA14 may form the tri-state inverter (e.g., the tri-state inverter 240 in FIG. 1).

The PMOS transistors PA7 and PA8, the NMOS transistors NA7, NA8 and NA10 and the inverter INVA2 in FIG. 7 may be substantially the same as the PMOS transistors PA7 and PA8, the NMOS transistors NA7, NA8 and NA10 and the inverter INVA2 in FIG. 2, respectively. The PMOS transistors PA7 and PA8 and the NMOS transistors NA7 and NA8 may form the NAND gate 260A in FIG. 2, the NMOS transistor NA10 may form the feedback and discharging unit 280A in FIG. 2, and the inverter INVA2 may form the output driver (e.g., the output driver 300 in FIG. 1).

Figure 8:
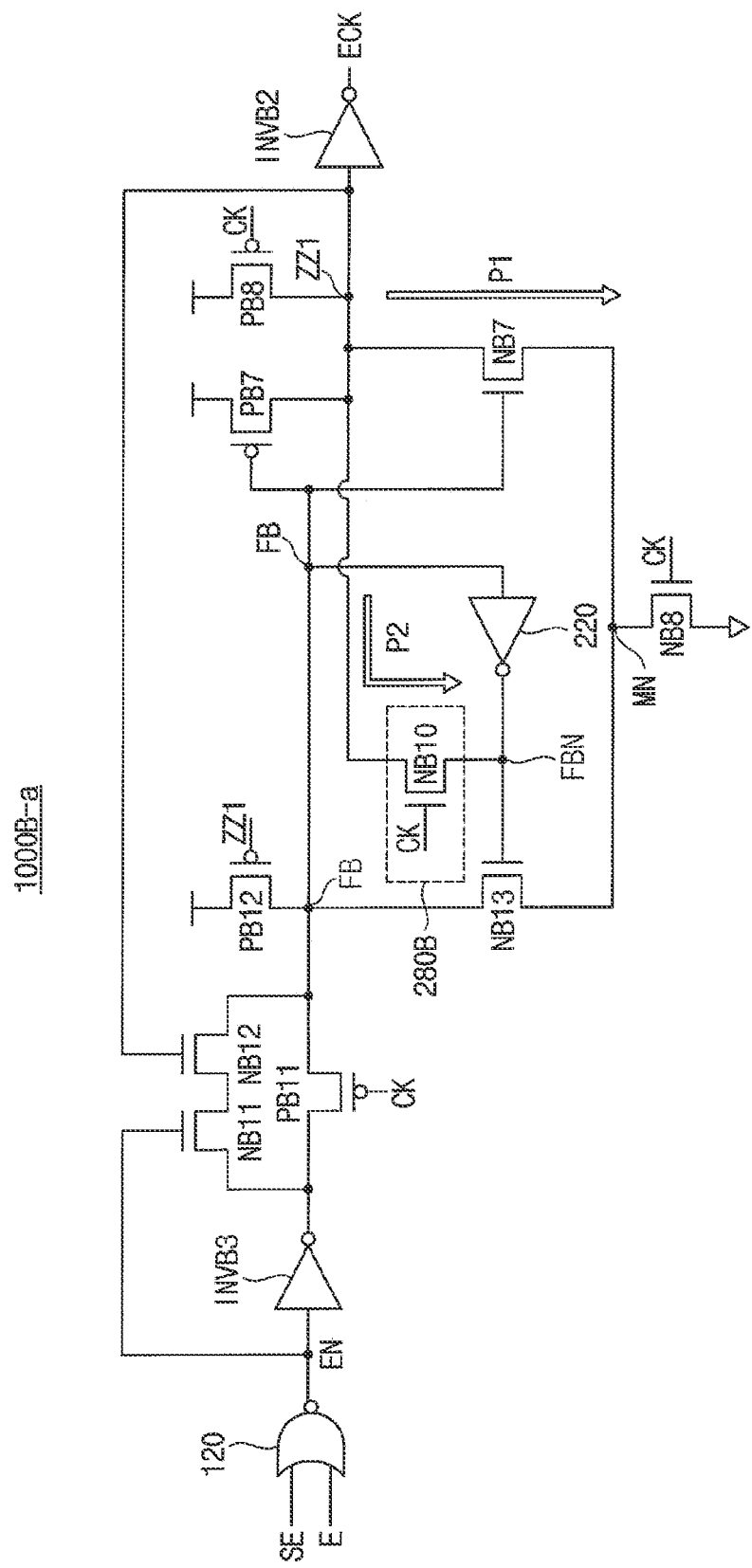

Referring to FIG. 8, an integrated clock gating cell 1000B-a may include a NOR gate 120, inverters INVB3, 220 and INVB2, PMOS transistors PB11, PB12, PB7 and PB8, and NMOS transistors NB11, NB12, NB13, NB10, NB7 and NB8. FIG. 8 illustrates an example in which configurations of the latch unit 140B and the tri-state inverter 240B are changed in the example of FIG. 4.

The inverter INVB3, the PMOS transistor PB11 and the NMOS transistors NB11 and NB12 in FIG. 8 may be substantially the same as the inverter INVA3, the PMOS transistor PA11 and the NMOS transistors NA11 and NA12 in FIG. 7, respectively, and may form the latch unit (e.g., the latch unit 140 in FIG. 1). The PMOS transistor PB12 and the NMOS transistors NB13 and NB8 in FIG. 8 may be substantially the same as the PMOS transistor PA12 and the NMOS transistors NA13 and NA14 in FIG. 7, respectively, and may form the tri-state inverter (e.g., the tri-state inverter 240 in FIG. 1). FIG. 8 illustrates an example in which two NMOS transistors NA14 and NA8 in FIG. 7 are merged into a single NMOS transistor NB8.

The PMOS transistors PB7 and PB8, the NMOS transistors NB7, NB10 and the inverter INVB2 in FIG. 8 may be substantially the same as the PMOS transistors PB7 and PB8, the NMOS transistors NB7, NB8 and NB10 and the inverter INVB2 in FIG. 4, respectively.

Figure 9:
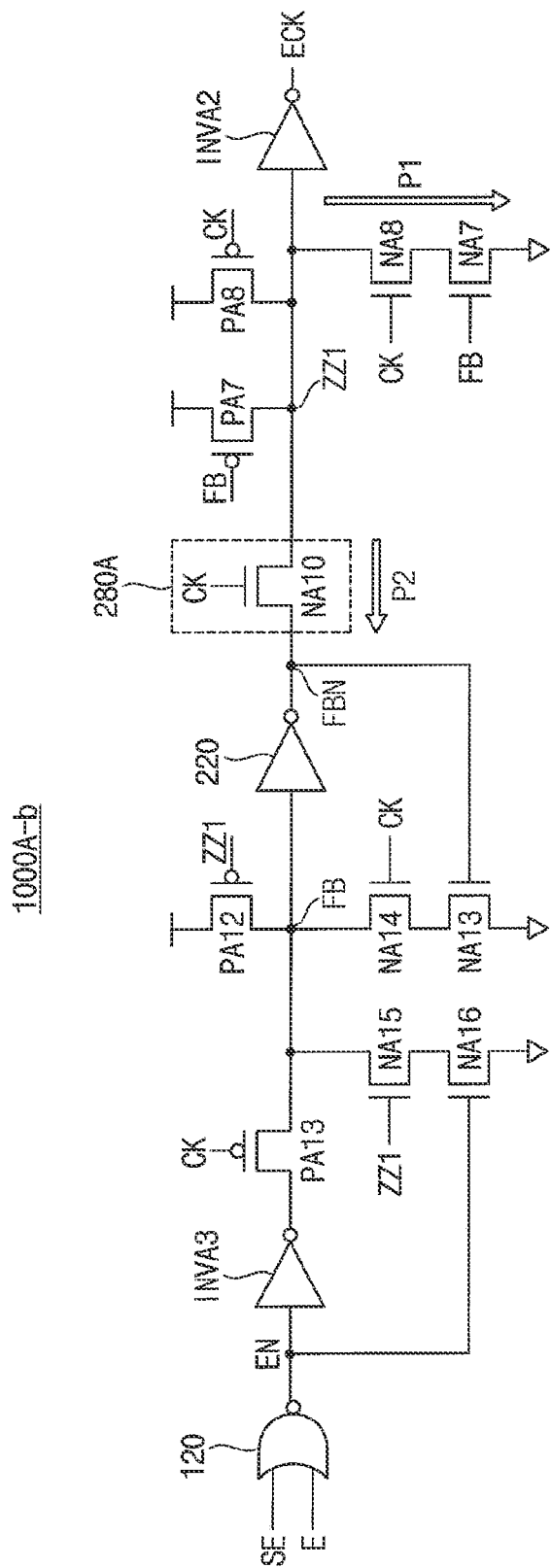

Referring to FIG. 9, an integrated clock gating cell 1000A-b may include a NOR gate 120, inverters INVA3, 220 and INVA2, PMOS transistors PA13, PA12, PA7 and PA8, and NMOS transistors NA15, NA16, NA13, NA14, NA10, NA7 and NA8. FIG. 9 illustrates an example in which configurations of the latch unit 140A and the tri-state inverter 240A are changed in the example of FIG. 2.

The inverter INVA3 may include an input terminal receiving the internal enable signal EN, and an output terminal. The PMOS transistor PA13 may be connected between the output terminal of the inverter INVA3 and the first node FB, and may include a control electrode receiving the input clock signal CK. The NMOS transistors NA15 and NA16 may be connected in series between the first node FB and the ground voltage. A control electrode of the NMOS transistor NA15 may be connected to the second node ZZ1, and a control electrode of the NMOS transistor NA16 may be connected to the input terminal of the inverter INVA3.

The inverter INVA3, the PMOS transistor PA13 and the NMOS transistors NA15 and NA16 may form the latch unit (e.g., the latch unit 140 in FIG. 1).

The PMOS transistor PA12 and the NMOS transistors NA13 and NA14 in FIG. 9 may be substantially the same as the PMOS transistor PA12 and the NMOS transistors NA13 and NA14 in FIG. 7, respectively. The PMOS transistors PA7 and PA8, the NMOS transistors NA7, NA8 and NA10 and the inverter INVA2 in FIG. 9 may be substantially the same as the PMOS transistors PA7 and PA8, the NMOS transistors NA7, NA8 and NA10 and the inverter INVA2 in FIG. 2, respectively.

Figure 10:
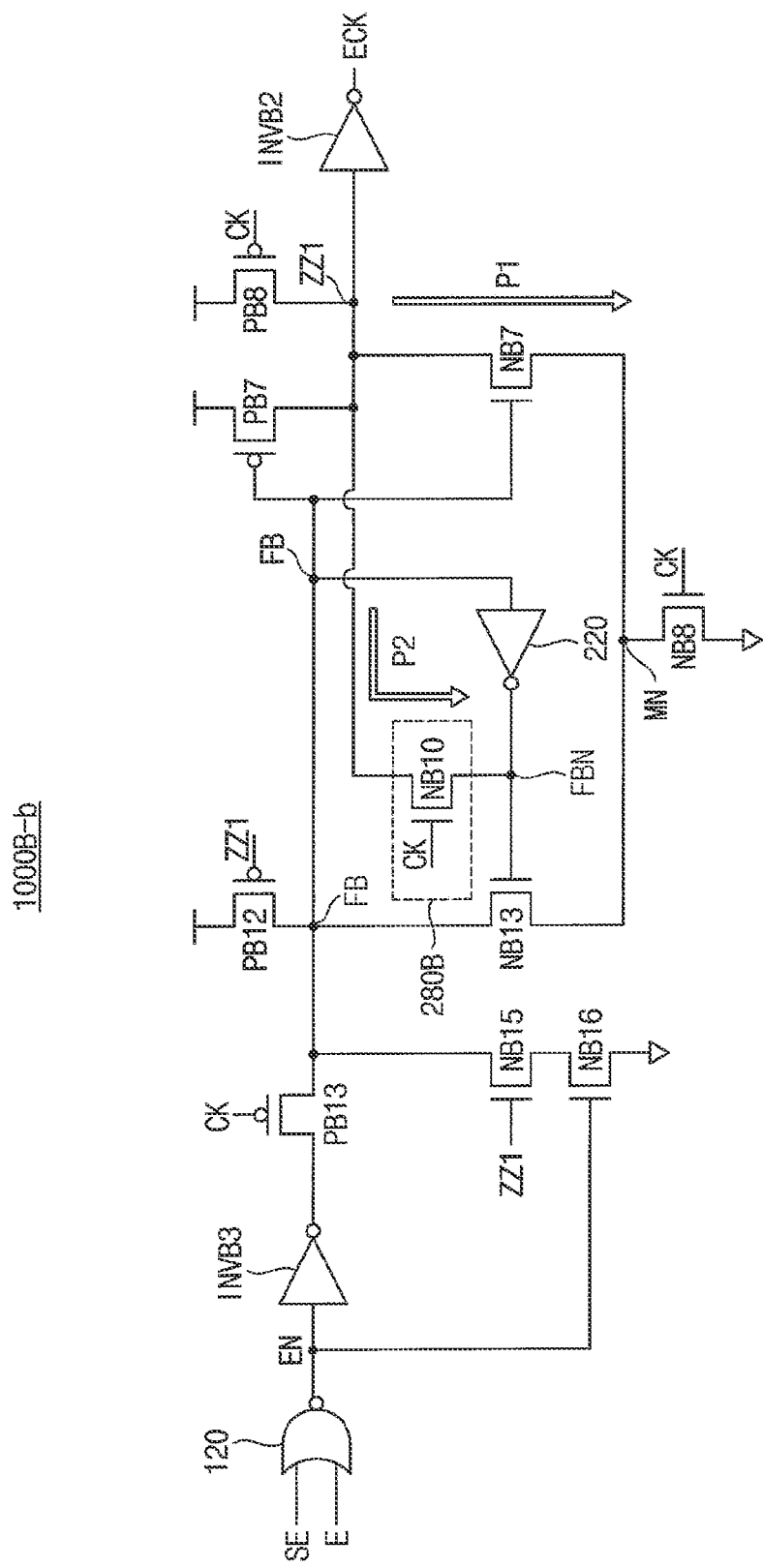

Referring to FIG. 10, an integrated clock gating cell 1000B-b may include a NOR gate 120, inverters INVB3, 220 and INVB2, PMOS transistors PB13, PB12, PB7 and PB8, and NMOS transistors NB15, NB16, NB13, NB10, NB7 and NB8. FIG. 10 illustrates an example in which configurations of the latch unit 140B and the tri-state inverter 240B are changed in the example of FIG. 4.

The inverter INVB3, the PMOS transistor PB13 and the NMOS transistors NB15 and NB16 in FIG. 10 may be substantially the same as the inverter INVA3, the PMOS transistor PA13 and the NMOS transistors NA15 and NA16 in FIG. 9, respectively. The PMOS transistor PB12 and the NMOS transistors NB13 and NB8 in FIG. 10 may be substantially the same as the PMOS transistor PA12 and the NMOS transistors NA13 and NA14 in FIG. 9, respectively. FIG. 10 illustrates an example in which two NMOS transistors NA14 and NA8 in FIG. 9 are merged into a single NMOS transistor NB8.

The PMOS transistors PB7 and PB8, the NMOS transistors NB7, NB8 and NB10 and the inverter INVB2 in FIG. 10 may be substantially the same as the PMOS transistors PB7 and PB8, the NMOS transistors NB7, NB8 and NB10 and the inverter INVB2 in FIG. 4, respectively.

Figure 11:
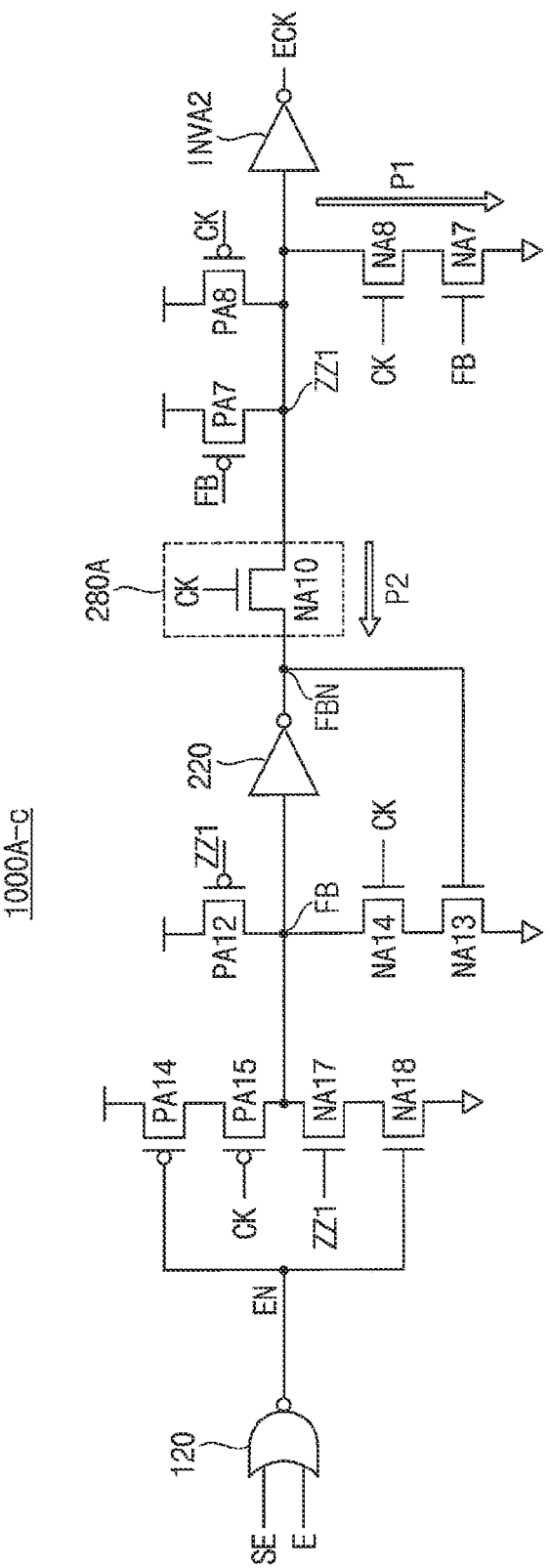

Referring to FIG. 11, an integrated clock gating cell 1000A-c may include a NOR gate 120, inverters 220 and INVA2, PMOS transistors PA14, PA15, PA12, PA7 and PA8, and NMOS transistors NA17, NA18, NA13, NA14, NA10, NA7 and NA8. FIG. 11 illustrates an example in which configurations of the latch unit 140A and the tri-state inverter 240A are changed in the example of FIG. 2.

The PMOS transistors PA14 and PA15 may be connected in series between the power supply voltage and the first node FB. A control electrode of the PMOS transistor PA14 may receive the internal enable signal EN, and a control electrode of the PMOS transistor PA15 may receive the input clock signal CK. The NMOS transistors NA17 and NA18 may be connected in series between the first node FB and the ground voltage. A control electrode of the NMOS transistor NA17 may be connected to the second node ZZ1, and a control electrode of the NMOS transistor NA18 may receive the internal enable signal EN.

The PMOS transistors PA14 and PA15 and the NMOS transistors NA17 and NA18 may form the latch unit (e.g., the latch unit 140 in FIG. 1).

The PMOS transistor PA12 and the NMOS transistors NA13 and NA14 in FIG. 11 may be substantially the same as the PMOS transistor PA12 and the NMOS transistors NA13 and NA14 in FIG. 7, respectively. The PMOS transistors PA7 and PA8, the NMOS transistors NA7, NA8 and NA10 and the inverter INVA2 in FIG. 11 may be substantially the same as the PMOS transistors PA7 and PA8, the NMOS transistors NA7, NA8 and NA10 and the inverter INVA2 in FIG. 2, respectively.

Figure 12:
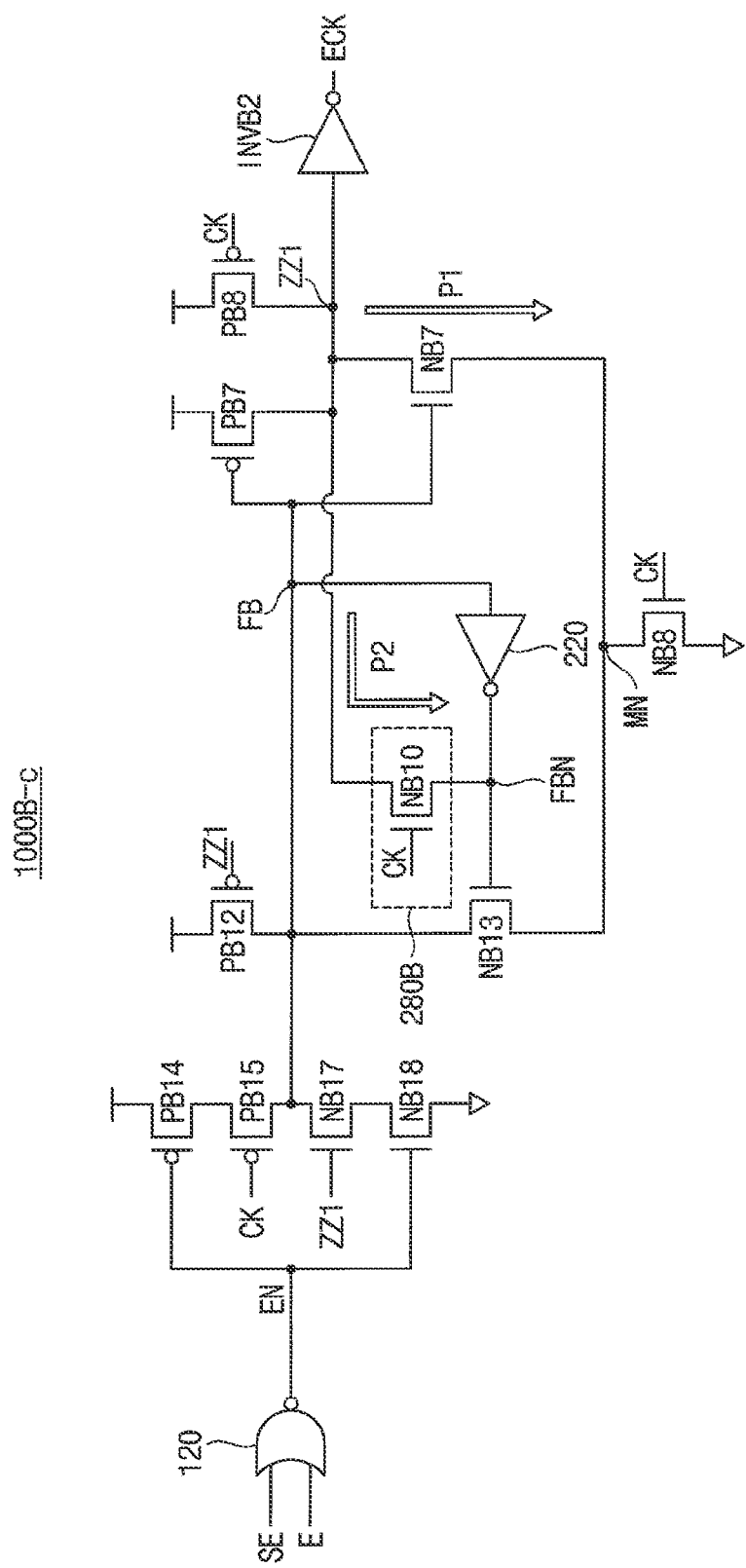

Referring to FIG. 12, an integrated clock gating cell 1000B-c may include a NOR gate 120, inverters 220 and INVB2, PMOS transistors PB14, PB15, PB12, PB7 and PB8, and NMOS transistors NB17, NB18, NB13, NB10, NB7 and NB8. FIG. 12 illustrates an example in which configurations of the latch unit 140B and the tri-state inverter 240B are changed in the example of FIG. 4.

The PMOS transistors PB14 and PB15 and the NMOS transistors NB17 and NB18 in FIG. 12 may be substantially the same as the PMOS transistors PA14 and PA15 and the NMOS transistors NA17 and NA18 in FIG. 11, respectively. The PMOS transistor PB12 and the NMOS transistors NB13 and NB8 in FIG. 12 may be substantially the same as the PMOS transistor PA12 and the NMOS transistors NA13 and NA14 in FIG. 11, respectively. FIG. 12 illustrates an example in which two NMOS transistors NA14 and NA8 in FIG. 11 are merged into a single NMOS transistor NB8.

The PMOS transistors PB7 and PB8, the NMOS transistors NB7, NB8 and NB10 and the inverter INVB2 in FIG. 12 may be substantially the same as the PMOS transistors PB7 and PB8, the NMOS transistors NB7, NB8 and NB10 and the inverter INVB2 in FIG. 4, respectively.

Figure 13:
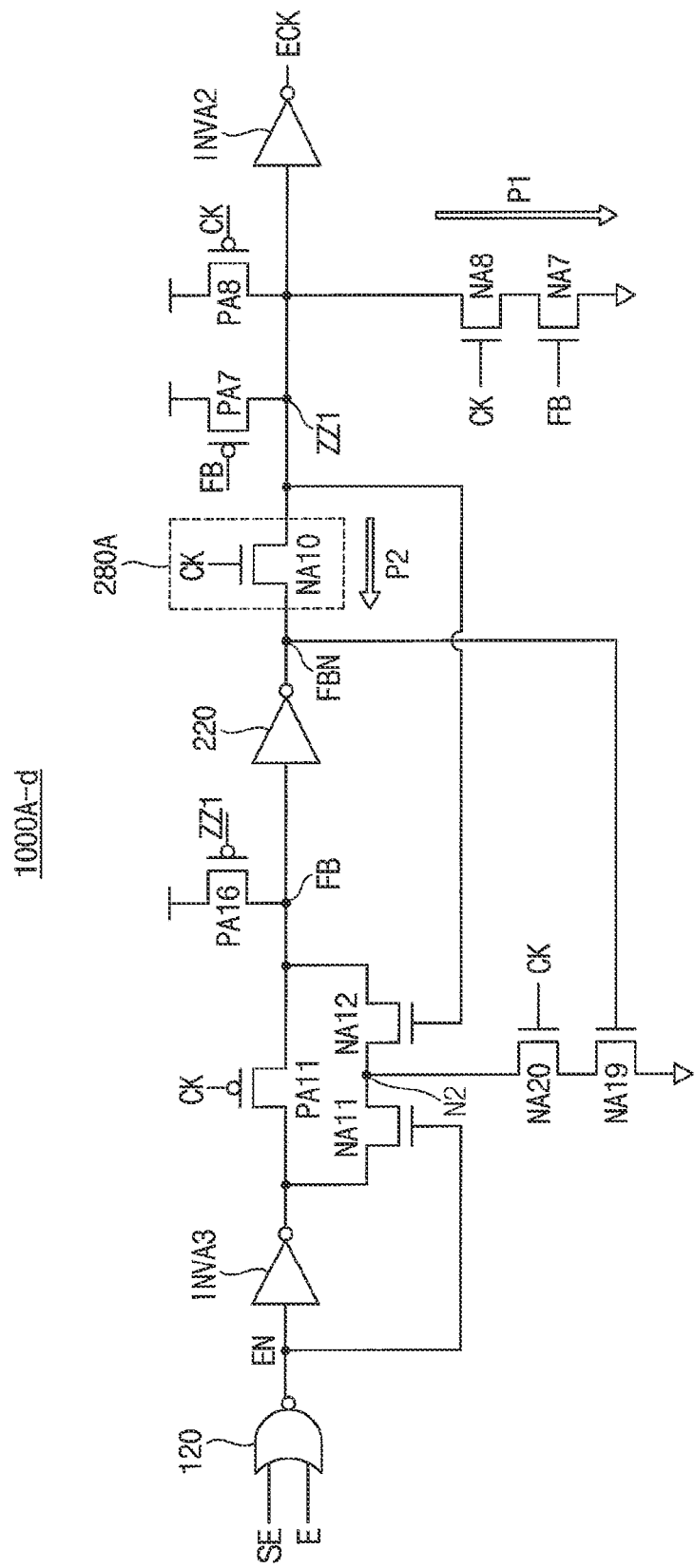

Referring to FIG. 13, an integrated clock gating cell 1000A-d may include a NOR gate 120, inverters INVA3, 220 and INVA2, PMOS transistors PA11, PA16, PA7 and PA8, and NMOS transistors NA11, NA12, NA19, NA20, NA10, NA7 and NA8. FIG. 13 illustrates an example in which configurations of the latch unit 140A and the tri-state inverter 240A are changed in the example of FIG. 2.

The inverter INVA3, the PMOS transistor PA11 and the NMOS transistors NA11 and NA12 in FIG. 13 may be substantially the same as the inverter INVA3, the PMOS transistor PA11 and the NMOS transistors NA11 and NA12 in FIG. 7, respectively.

The PMOS transistor PA16 may be connected between the power supply voltage and the first node FB, and may include a control electrode connected to the second node ZZ1. The NMOS transistors NA19 and NA20 may be connected in series between a node N2 included in the input logic and latch unit and the ground voltage. For example, the node N2 may be a node between the NMOS transistors NA11 and NA12 included in the latch unit. A control electrode of the NMOS transistor NA19 may be connected to the third node FBN, and a control electrode of the NMOS transistor NA20 may receive the input clock signal CK.

The PMOS transistor PA16 and the NMOS transistors NA19 and NA20 may form the tri-state inverter (e.g., the tri-state inverter 240 in FIG. 1).

The PMOS transistors PA7 and PA8, the NMOS transistors NA7, NA8 and NA10 and the inverter INVA2 in FIG. 13 may be substantially the same as the PMOS transistors PA7 and PA8, the NMOS transistors NA7, NA8 and NA10 and the inverter INVA2 in FIG. 2, respectively.

Figure 14:
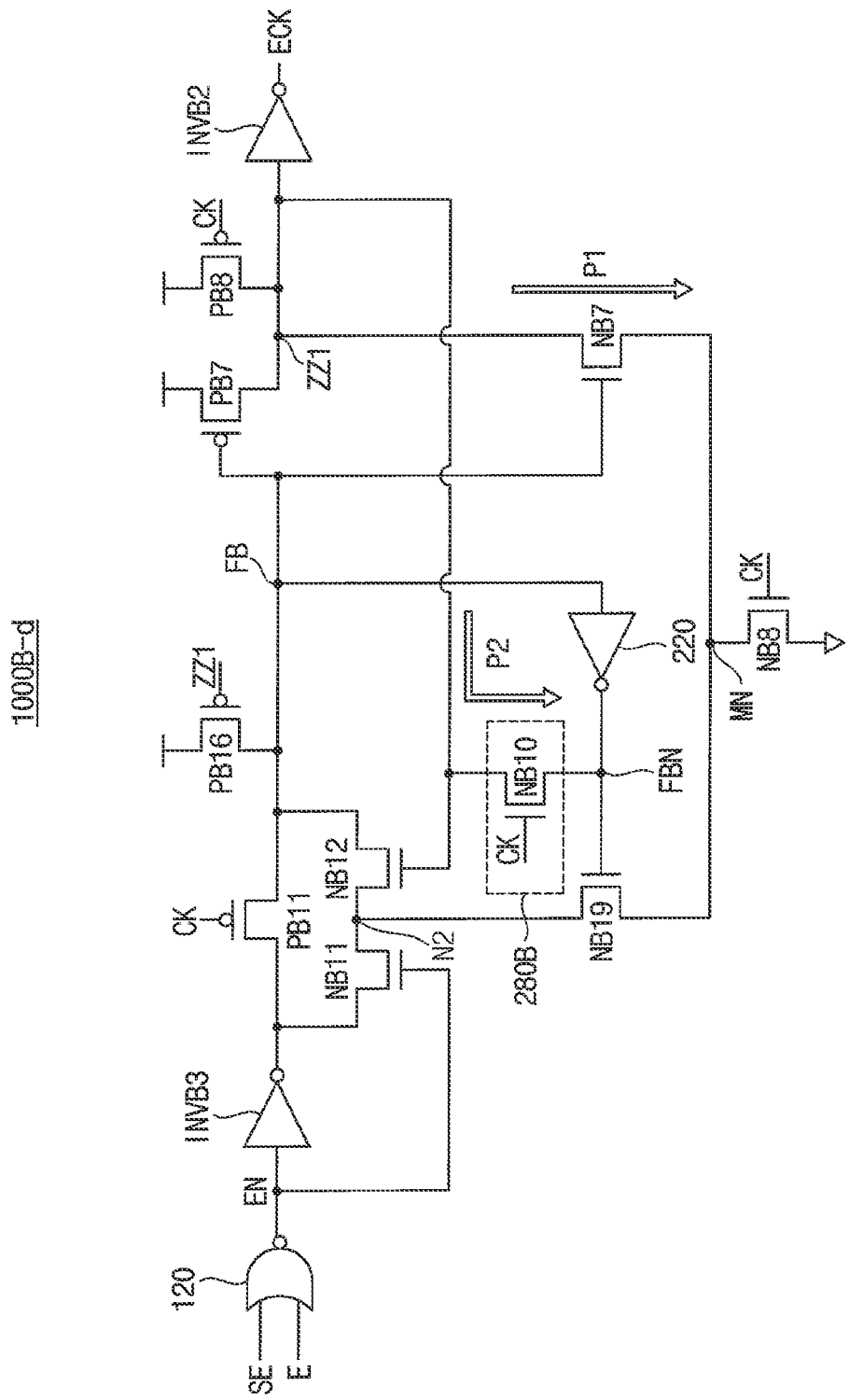

Referring to FIG. 14, an integrated clock gating cell 1000B-d may include a NOR gate 120, inverters INVB3, 220 and INVB2, PMOS transistors PB11, PB16, PB7 and PB8, and NMOS transistors NB11, NB12, NB19, NB10, NB7 and NB8. FIG. 14 illustrates an example in which configurations of the latch unit 140B and the tri-state inverter 240B are changed in the example of FIG. 4.

The inverter INVB3, the PMOS transistor PB11 and the NMOS transistors NB11 and NB12 in FIG. 14 may be substantially the same as the inverter INVA3, the PMOS transistor PA11 and the NMOS transistors NA11 and NA12 in FIG. 13, respectively. The PMOS transistor PB16 and the NMOS transistors NB19 and NB8 in FIG. 14 may be substantially the same as the PMOS transistor PA16 and the NMOS transistors NA19 and NA20 in FIG. 13, respectively. FIG. 14 illustrates an example in which two NMOS transistors NA20 and NA8 in FIG. 13 are merged into a single NMOS transistor NB8.

The PMOS transistors PB7 and PB8, the NMOS transistors NB7, NB8 and NB10 and the inverter INVB2 in FIG. 14 may be substantially the same as the PMOS transistors PB7 and PB8, the NMOS transistors NB7, NB8 and NB10 and the inverter INVB2 in FIG. 4, respectively.

Figure 15:
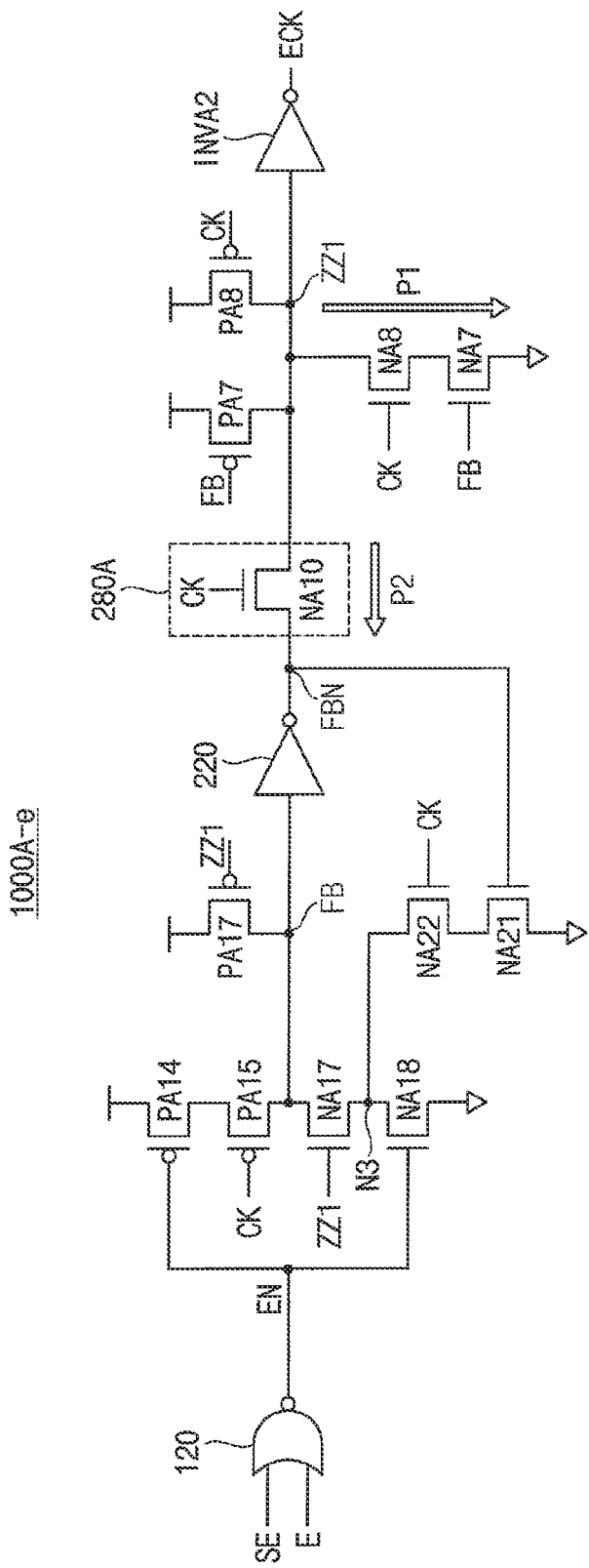

Referring to FIG. 15, an integrated clock gating cell 1000A-e may include a NOR gate 120, inverters 220 and INVA2, PMOS transistors PA14, PA15, PA17, PA7 and PA8, and NMOS transistors NA17, NA18, NA21, NA22, NA10, NA7 and NA8. FIG. 15 illustrates an example in which configurations of the latch unit 140A and the tri-state inverter 240A are changed in the example of FIG. 2.

The PMOS transistors PA14 and PA15 and the NMOS transistors NA17 and NA18 in FIG. 15 may be substantially the same as the PMOS transistors PA14 and PA15 and the NMOS transistors NA17 and NA18 in FIG. 11, respectively.

The PMOS transistor PA17 may be connected between the power supply voltage and the first node FB, and may include a control electrode connected to the second node ZZ1. The NMOS transistors NA21 and NA22 may be connected in series between a node N3 included in the input logic and latch unit and the ground voltage. For example, the node N3 may be a node between the NMOS transistors NA17 and NA18 included in the latch unit. A control electrode of the NMOS transistor NA21 may be connected to the third node FBN, and a control electrode of the NMOS transistor NA22 may receive the input clock signal CK.

The PMOS transistor PA17 and the NMOS transistors NA21 and NA22 may form the tri-state inverter (e.g., the tri-state inverter 240 in FIG. 1).

The PMOS transistors PA7 and PA8, the NMOS transistors NA7, NA8 and NA10 and the inverter INVA2 in FIG. 15 may be substantially the same as the PMOS transistors PA7 and PA8, the NMOS transistors NA7, NA8 and NA10 and the inverter INVA2 in FIG. 2, respectively.

Figure 16:
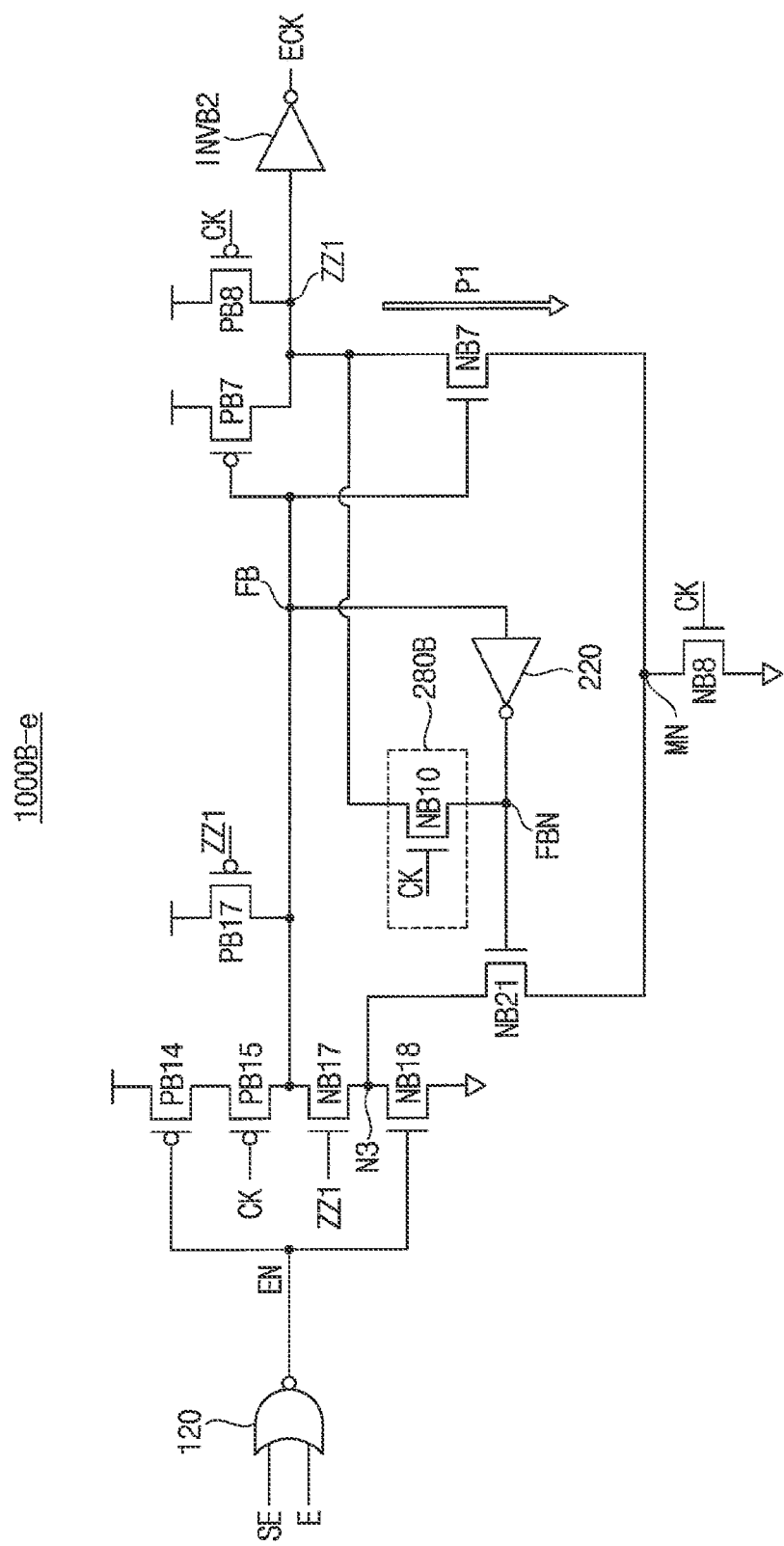

Referring to FIG. 16, an integrated clock gating cell 1000B-e may include a NOR gate 120, inverters 220 and INVB2, PMOS transistors PB14, PB15, PB17, PB7 and PB8, and NMOS transistors NB17, NB18, NB21, NB10, NB7 and NB8. FIG. 16 illustrates an example in which configurations of the latch unit 140B and the tri-state inverter 240B are changed in the example of FIG. 4.

The PMOS transistors PB14 and PB15 and the NMOS transistors NB17 and NB18 in FIG. 16 may be substantially the same as the PMOS transistors PA14 and PA15 and the NMOS transistors NA17 and NA18 in FIG. 15, respectively. The PMOS transistors PB17 and NMOS transistors NB21 and NB8 in FIG. 16 may be substantially the same as the PMOS transistor PA17 and NMOS transistors NA21 and NA22 in FIG. 15, respectively. FIG. 16 illustrates an example in which two NMOS transistors NA22 and NA8 in FIG. 15 are merged into a single NMOS transistor NB8.

The PMOS transistors PB7 and PB8, the NMOS transistors NB7, NB8 and NB10 and the inverter INVB2 in FIG. 16 may be substantially the same as the PMOS transistors PB7 and PB8, the NMOS transistors NB7, NB8 and NB10 and the inverter INVB2 in FIG. 4, respectively.

In summary, among the integrated clock gating cells illustrated in FIGS. 7 through 16, the integrated clock gating cells including the same capital letter "A" in the reference numerals (e.g., the integrated clock gating cells 1000A-a, 1000A-b, 1000A-c, 1000A-d and 1000A-e of FIGS. 7, 9, 11, 13 and 15) may have configurations in which a portion of the integrated clock gating cell 1000A of FIG. 2 is modified. Similarly, among the integrated clock gating cells illustrated in FIGS. 7 through 16, the integrated clock gating cells including the same capital letter "B" in the reference numerals (e.g., the integrated clock gating cells 1000B-a, 1000B-b, 1000B-c, 1000B-d and 1000B-e of FIGS. 8, 10, 12, 14 and 16) may have configurations in which a portion of the integrated clock gating cell 1000B of FIG. 4 is modified. In addition, the integrated clock gating cells having the same small letter in the reference numerals (e.g., the integrated clock gating cells 1000A-a and 1000B-a of FIGS. 7 and 8 having the same small letter "a") may have substantially the same configuration except that two NMOS transistors that receive the input clock signal CK are merged into a single NMOS transistor.

Although various examples of the integrated clock gating cell have been described with reference to FIGS. 7 through 16, exemplary embodiments are not limited thereto, and exemplary embodiments may be changed in a range in which two or more discharge paths for the second node ZZ1 are implemented and at least one of the discharge paths simultaneously performs the feedback function and the discharge function.

Figure 17:
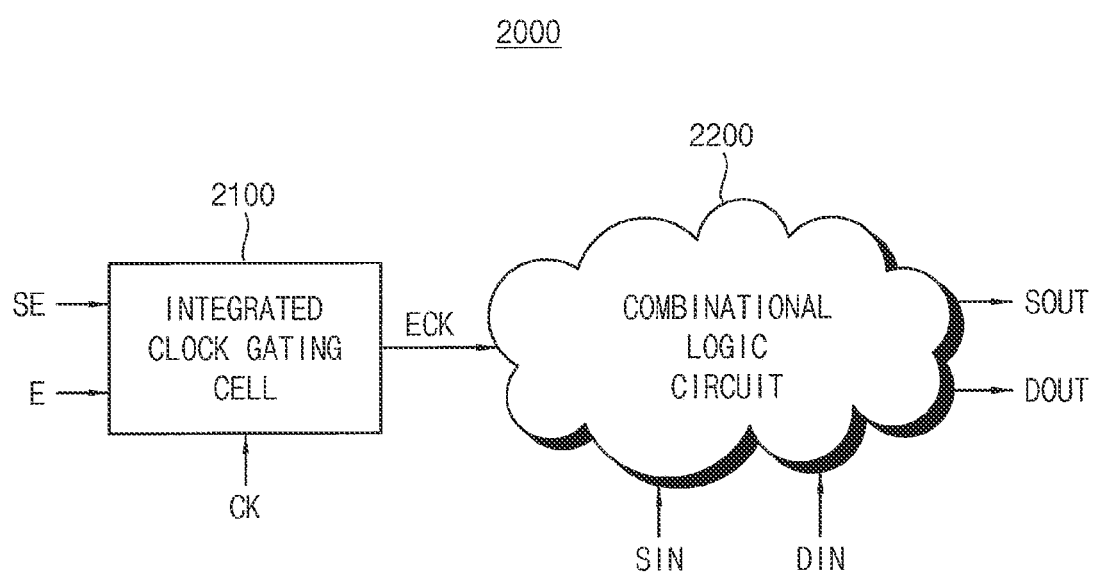
FIG. 17 is a block diagram illustrating an integrated circuit including an integrated clock gating cell according to exemplary embodiments.

FIG. 17 is a block diagram illustrating an integrated circuit including an integrated clock gating cell according to exemplary embodiments.

Referring to FIG. 17, an integrated circuit 2000 includes an integrated clock gating cell 2100 and a combinational logic circuit 2200.

The integrated clock gating cell 2100 selectively provides an output clock signal ECK to the combinational logic circuit 2200 based on at least one input enable signal SE and E and an input clock signal CK.

The integrated clock gating cell 2100 may be the integrated clock gating cell according to exemplary embodiments described with reference to FIGS. 1 through 16. The integrated clock gating cell 2100 may include a plurality of (e.g., two or more) discharge paths. In addition, at least one of the plurality of discharge paths may be formed or implemented using the feedback inverter 220, and may substantially simultaneously perform the feedback function and the discharge function. Accordingly, the integrated clock gating cell 2100 may have relatively low power consumption and high operating speed. Further, as the number of the discharge paths increases, a time required for the output clock signal ECK to be activated after the input clock signal CK is activated (e.g., CK-to-ECK) may be improved.

The combinational logic circuit 2200 performs various logic operations on data based on the output clock signal ECK. For example, the combinational logic circuit 2200 may perform a logic operation on first input data SIN based on the output clock signal ECK to generate first output data SOUT, or may perform a logic operation on second input data DIN based on the output clock signal ECK to generate second output data DOUT. For example, the first input data SIN and the first output data SOUT may be input/output data for a scan test, and the second input data DIN and the second output data DOUT may be input/output data for normal or general data processing.

In exemplary embodiments, the integrated circuit 2000 may be designed to include a scan chain circuit as a design-for-test (DFT) circuit for facilitating an efficient test of the integrated circuit 2000. For example, a scan test for the integrated circuit 2000 may be performed using the scan chain circuit. For example, a shift-in operation may be performed to sequentially input a predetermined test pattern as a scan input SIN to the scan chain circuit. Further, a capture operation may be performed such that the test pattern loaded into the scan chain circuit is provided to the combinational logic circuit 2200 to generate observed values based on the test pattern, and the observed values of the combinational logic circuit 2200 are stored in the scan chain circuit. In addition, a shift-out operation may be performed to sequentially output the observed values stored in the scan chain circuit, as a scan output SOUT.

In exemplary embodiments, a plurality of similar or different test patterns may be used. In one case, the shift-out operation that outputs the observed values for one test pattern and the shift-in operation that inputs the next test pattern may be performed substantially at the same time. In other cases, the shift-out operation that outputs the observed values for one test pattern and the shift-in operation that inputs the next test pattern may be performed at different times. For example, the shift-out operation could be performed before the shift-in operation of the next test pattern. Or, as another example, the shift-in operation of the next test pattern could be performed before the shift out operation.

Figure 18:
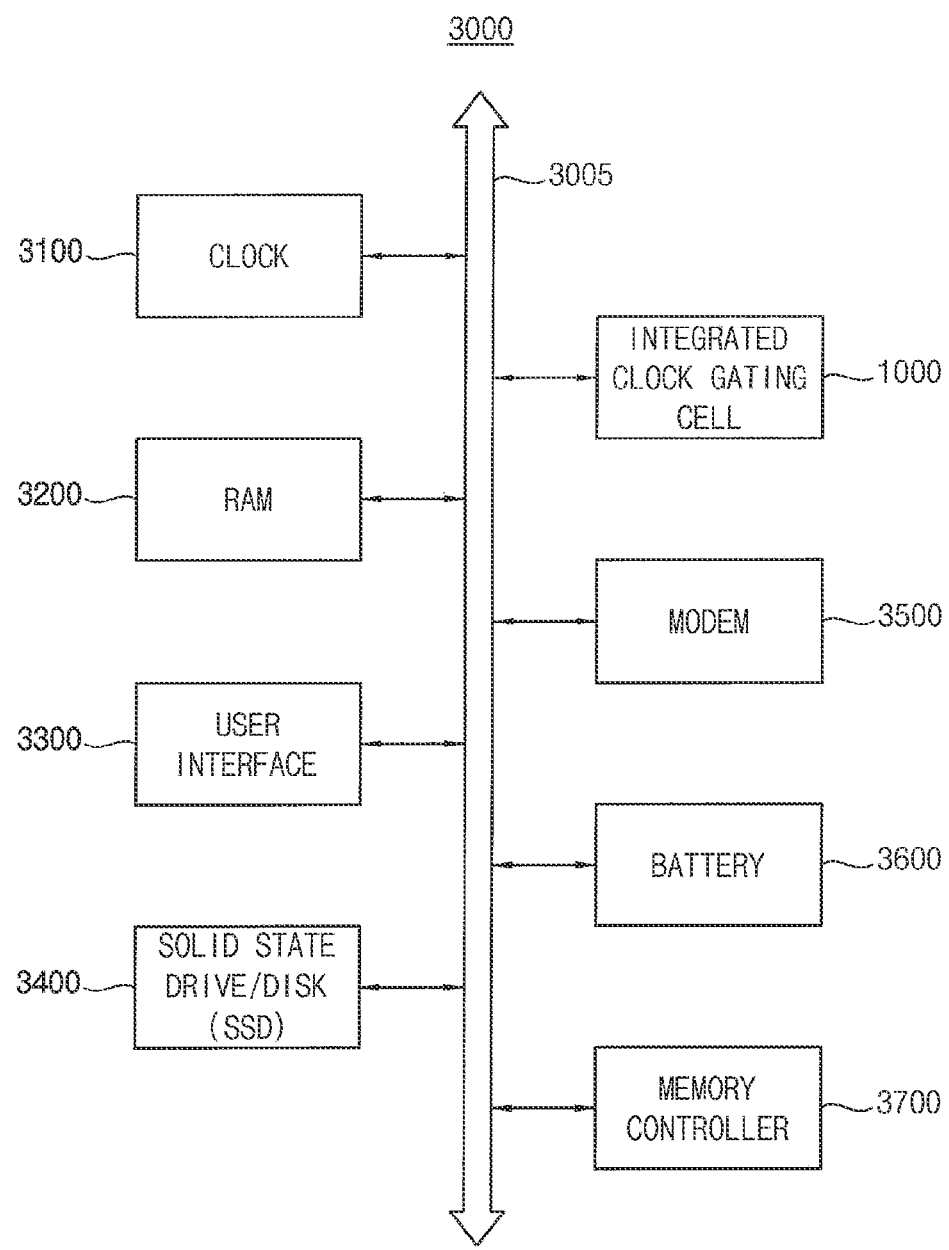
FIG. 18 is a block diagram illustrating a computing system including an integrated clock gating cell according to exemplary embodiments.

FIG. 18 is a block diagram illustrating a computing system including an integrated clock gating cell according to exemplary embodiments.

Referring to FIG. 18, a computing system 3000 may include a clock 3100, a random access memory (RAM) 3200, a user interface 3300, a solid state drive/disk (SSD) 3400, an integrated clock gating cell 1000, a modem 3500 such as a baseband chipset, a battery 3600, and/or a memory controller 3700, any or all of which may be electrically connected to a system bus 3005. The integrated clock gating cell 1000 may be the integrated clock gating cell according to exemplary embodiments described with reference to FIGS. 1 through 16. The computing system 3000 including the integrated clock gating cell 1000 may correspond to the exemplary embodiments described in detail above, and may also be electrically connected to the system bus 3005.

If the computing system 3000 is a mobile device, the battery 3600 may supply power to the computing system 3000. The computing system 3000 may further include an application chipset, a camera image processor (CIS), a mobile DRAM, etc.

In exemplary embodiments, the computing system 3000 may be used as, for example, a computer, computer server, server rack, portable computer, Ultra Mobile PC (UMPC), workstation, net-book, personal digital assistant (PDA), web tablet, wireless phone, mobile phone, smartphone, e-book, portable multimedia player (PMP), digital camera, digital audio recorder/player, digital picture/video recorder/player, portable game machine, navigation system, black box, 3-dimensional television, a device capable of transmitting and receiving information at a wireless circumstance, one of various electronic devices constituting a home network, one of various electronic devices constituting a computer network, one of various electronic devices constituting a telematics network, RFID, one of various electronic devices constituting a computing system, etc.

Exemplary embodiments are described herein, and illustrated in the drawings, in terms of functional blocks, units and/or modules. Those skilled in the art will appreciate that these blocks, units and/or modules can be physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the present disclosure. Further, the blocks, units and/or modules of the exemplary embodiments may be physically combined into more complex blocks, units and/or modules without departing from the scope of the present disclosure.

The disclosure may be applied to various electronic devices and electronic systems including the integrated clock gating cell. For example, the disclosure may be applied to systems such as a personal computer (PC), a server computer, a data center, a workstation, a mobile phone, a smartphone, a tablet computer, a laptop computer, a PDA, a PMP, a digital camera, a portable game console, a music player, a camcorder, a video player, a navigation device, a wearable device, an Internet of things (IoT) device, an Internet of everything (IoE) device, an e-book reader, a virtual reality (VR) device, an augmented reality (AR) device, a robotic device, a drone, etc.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. An integrated clock gating cell, comprising:
    an input logic and latch circuit that generates an internal enable signal based on a first input enable signal and a second input enable signal, and that generates a first internal signal provided to a first node based on the internal enable signal and an input clock signal;
    a keeper logic and signal generating circuit connected between the first node and a second node,
    wherein the keeper logic and signal generating circuit comprises a feedback path that feeds back the first internal signal, generates a second internal signal provided to the second node based on the first internal signal and the input clock signal, and further comprises a first path and a second path that discharges the second node,
    wherein the first path is different from the second path, and each of the first path and the second path is connected to the second node; and
    an output driver that generates an output clock signal based on the second internal signal.

2. The integrated clock gating cell of claim 1, wherein the second path simultaneously performs a feedback function and a discharge function.

3. The integrated clock gating cell of claim 1, wherein the keeper logic and signal generating circuit comprises:
    a feedback inverter comprising an input terminal connected to the first node and an output terminal connected to a third node, and forming the feedback path;
    a tri-state inverter comprising an input terminal connected to the third node and an output terminal connected to the first node, and forming the feedback path;
    a NAND gate comprising a first input terminal receiving the input clock signal, a second input terminal connected to the first node, and an output terminal connected to the second node, and forming the first path; and
    a feedback and discharging circuit connected between the second node and the third node, and forming the second path.

4. The integrated clock gating cell of claim 3, wherein the feedback and discharging circuit comprises:
    an n-type metal oxide semiconductor (NMOS) transistor comprising a first electrode connected to the second node, a control electrode receiving the input clock signal, and a second electrode connected to the third node.

5. The integrated clock gating cell of claim 3, wherein the NAND gate and the tri-state inverter share at least one element.

6. The integrated clock gating cell of claim 5, wherein the NAND gate comprises:
    a first p-type metal oxide semiconductor (PMOS) transistor;
    a second PMOS transistor connected in parallel to the first PMOS transistor between a power supply voltage and the second node,
    wherein the first PMOS transistor comprises a control electrode connected to the first node, and the second PMOS transistor comprises a control electrode receiving the input clock signal;
    a first n-type metal oxide semiconductor (NMOS) transistor; and
    a second NMOS transistor connected in series to the first NMOS transistor between the second node and a ground voltage,
    wherein the first NMOS transistor comprises a control electrode connected to the first node, and the second NMOS transistor comprises a control electrode receiving the input clock signal,
    wherein the second NMOS transistor receiving the input clock signal is shared by the NAND gate and the tri-state inverter.

7. The integrated clock gating cell of claim 3, wherein the tri-state inverter comprises:
    a first p-type metal oxide semiconductor (PMOS) transistor;
    a second PMOS transistor connected in series to the first PMOS transistor between a power supply voltage and the first node, wherein the first PMOS transistor comprises a control electrode connected to the third node, and the second PMOS transistor comprises a control electrode receiving an inverted input clock signal;
a first n-type metal oxide semiconductor (NMOS) transistor; and
a second NMOS transistor connected in series to the first NMOS transistor between the first node and a ground voltage,
wherein the first NMOS transistor comprises a control electrode connected to the third node, and the second NMOS transistor comprises a control electrode receiving the input clock signal.

8. The integrated clock gating cell of claim 3, wherein the tri-state inverter comprises:
a p-type metal oxide semiconductor (PMOS) transistor connected between a power supply voltage and the first node, and comprising a control electrode connected to the second node;
a first n-type metal oxide semiconductor (NMOS) transistor; and
a second NMOS transistor connected in series between the first node and a ground voltage,
wherein the first NMOS transistor comprises a control electrode connected to the third node, and the second NMOS transistor comprises a control electrode receiving the input clock signal.

9. The integrated clock gating cell of claim 3, wherein the tri-state inverter comprises:
a p-type metal oxide semiconductor (PMOS) transistor connected between a power supply voltage and the first node, and comprising a control electrode connected to the second node;
a first n-type metal oxide semiconductor (NMOS) transistor; and
a second NMOS transistor connected in series between a fourth node and a ground voltage,
wherein the fourth node is included in the input logic and latch circuit, the first NMOS transistor comprises a control electrode connected to the third node, and the second NMOS transistor comprises a control electrode receiving the input clock signal.

10. The integrated clock gating cell of claim 3, wherein the feedback inverter comprises:
a p-type metal oxide semiconductor (PMOS) transistor connected between a power supply voltage and the third node, and comprising a control electrode connected to the first node; and
an n-type metal oxide semiconductor (NMOS) transistor connected between the third node and a ground voltage, and comprising a control electrode connected to the first node.

11. The integrated clock gating cell of claim 3, wherein the feedback inverter comprises:
a p-type metal oxide semiconductor (PMOS) transistor connected between the second node and the third node, and comprising a control electrode connected to the first node; and
an n-type metal oxide semiconductor (NMOS) transistor connected between the third node and a ground voltage, and comprising a control electrode connected to the first node.

12. The integrated clock gating cell of claim 1, wherein the input logic and latch circuit comprises:
a NOR gate comprising a first input terminal receiving the first input enable signal, a second input terminal receiving the second input enable signal, and an output terminal outputting the internal enable signal; and
a latch comprising a first input terminal receiving the internal enable signal, a second input terminal receiving the input clock signal, and an output terminal connected to the first node.

13. The integrated clock gating cell of claim 12, wherein the latch comprises:
a first p-type metal oxide semiconductor (PMOS) transistor;
a second PMOS transistor connected in series to the first PMOS transistor between a power supply voltage and the first node,
wherein the first PMOS transistor comprises a control electrode receiving the internal enable signal, and the second PMOS transistor comprises a control electrode receiving the input clock signal;
a first n-type metal oxide semiconductor (NMOS) transistor; and
a second NMOS transistor connected in series to the first NMOS transistor between the first node and a ground voltage,
wherein the first NMOS transistor comprises a control electrode receiving an inverted input clock signal, and the second NMOS transistor comprises a control electrode receiving the internal enable signal.

14. The integrated clock gating cell of claim 12, wherein the latch comprises:
an inverter comprising an input terminal receiving the internal enable signal and an output terminal;
a p-type metal oxide semiconductor (PMOS) transistor connected between the output terminal of the inverter and the first node, and comprising a control electrode receiving the input clock signal;
a first n-type metal oxide semiconductor (NMOS) transistor; and
a second NMOS transistor connected in series to the first NMOS transistor between the output terminal of the inverter and the first node,
wherein the first NMOS transistor comprises a control electrode connected to the input terminal of the inverter, and the second NMOS transistor comprises a control electrode connected to the second node.

15. The integrated clock gating cell of claim 12, wherein the latch comprises:
an inverter comprising an input terminal receiving the internal enable signal and an output terminal;
a p-type metal oxide semiconductor (PMOS) transistor connected between the output terminal of the inverter and the first node, and comprising a control electrode receiving the input clock signal;
a first n-type metal oxide semiconductor (NMOS) transistor; and
a second NMOS transistor connected in series to the first NMOS transistor between the first node and a ground voltage,
wherein the first NMOS transistor comprises a control electrode connected to the second node, and the second NMOS transistor comprises a control electrode connected to the input terminal of the inverter.

16. The integrated clock gating cell of claim 12, wherein the latch comprises:
a first p-type metal oxide semiconductor (PMOS) transistor;
a second PMOS transistor connected in series to the first PMOS transistor between a power supply voltage and the first node, wherein the first PMOS transistor comprises a control electrode receiving the internal enable signal, and the second PMOS transistor comprises a control electrode receiving the input clock signal;
a first n-type metal oxide semiconductor (NMOS) transistor; and
a second NMOS transistor connected in series to the first NMOS transistor between the first node and a ground voltage,
wherein the first NMOS transistor comprises a control electrode connected to the second node, and the second NMOS transistor comprises a control electrode receiving the internal enable signal.

17. The integrated clock gating cell of claim 12, wherein the NOR gate comprises:
a first p-type metal oxide semiconductor (PMOS) transistor;
a second PMOS transistor connected in series to the first PMOS transistor between a power supply voltage and a third node,
wherein the first PMOS transistor comprises a control electrode receiving the first input enable signal, and the second PMOS transistor comprises a control electrode receiving the second input enable signal;
a first n-type metal oxide semiconductor (NMOS) transistor; and
a second NMOS transistor connected in parallel to the first NMOS transistor between the third node and a ground voltage,
wherein the first NMOS transistor comprises a control electrode receiving the first input enable signal, and the second NMOS transistor comprises a control electrode receiving the second input enable signal.

18. The integrated clock gating cell of claim 1, wherein the output driver comprises:
an inverter comprising an input terminal connected to the second node and an output terminal outputting the output clock signal.

19. An integrated circuit, comprising:
a combinational logic circuit configured to perform a logic operation on data based on an output clock signal; and
an integrated clock gating cell configured to selectively provide the output clock signal to the combinational logic circuit based on at least one input enable signal and an input clock signal,
wherein the integrated clock gating cell comprises:
an input logic and latch circuit that generates an internal enable signal based on a first input enable signal and a second input enable signal, and that generates a first internal signal provided to a first node based on the internal enable signal and the input clock signal;
a keeper logic and signal generating circuit connected between the first node and a second node,
wherein the keeper logic and signal generating circuit comprises a feedback path that feeds back the first internal signal, generates a second internal signal provided to the second node based on the first internal signal and the input clock signal, and further comprises a first path and a second path that discharges the second node,
wherein the first path is different from the second path, and each of the first path and the second path is connected to the second node; and
an output driver that generates the output clock signal based on the second internal signal.

20. An integrated clock gating cell, comprising:
a NOR gate that generates an internal enable signal based on a first input enable signal and a second input enable signal;
a latch that generates a first internal signal provided to a first node based on the internal enable signal and an input clock signal;
a NAND gate connected between the first node and a second node, that generates a second internal signal provided to the second node based on the first internal signal and the input clock signal, and that forms a first path that discharges the second node;
a feedback inverter comprising an input terminal connected to the first node and an output terminal connected to a third node, and comprising a feedback path that feeds back the first internal signal;
a tri-state inverter comprising an input terminal connected to the third node and an output terminal connected to the first node, and forming the feedback path;
a feedback and discharging circuit connected between the second node and the third node, and forming a second path that discharges the second node; and
an output driver that generates an output clock signal based on the second internal signal,
wherein the first path is different from the second path, each of the first path and the second path is connected to the second node, and the second path simultaneously performs a feedback function and a discharge function.

* * * * *